(12) United States Patent
Fukuda et al.

(10) Patent No.: US 6,697,788 B1
(45) Date of Patent: Feb. 24, 2004

(54) PROCESSING DEVICE SEARCHING FOR AN OPTIMUM VALUE OF A COST FUNCTION BY USING DYNAMICS

(75) Inventors: Ikuo Fukuda, Kanagawa (JP); Shigeru Kameda, Kanagawa (JP); Shoichi Masuda, Kanagawa (JP); Ichiro Suzuki, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/494,532

(22) Filed: Jan. 31, 2000

(30) Foreign Application Priority Data

Feb. 3, 1999 (JP) .......................................... 11-026763

(51) Int. Cl.[7] ................................................ G06N 5/02
(52) U.S. Cl. ......................................... 706/7; 382/250
(58) Field of Search .................. 706/7; 705/8; 382/250

(56) References Cited

U.S. PATENT DOCUMENTS 5,734,755 A * 3/1998 Ramchandran et al. ..... 382/250
6,032,123 A * 2/2000 Jameson ........................ 705/8

OTHER PUBLICATIONS

Gear, C. William, Applications and Algorithms in Science and Engineering, Science Research Associates, Inc., 1978, pp. A8–A12.*

* cited by examiner

*Primary Examiner*—Wilbert L. Starks, Jr.
(74) *Attorney, Agent, or Firm*—Staas & Halsey LLP

(57) ABSTRACT

In an optimization problem, an optimum solution is searched by using the deterministic dynamics which has a neighborhood search capability, is not trapped into a local minimum state during a search using a search speed control mechanism, and improves the realization probability of the optimum state independent of the search speed.

8 Claims, 53 Drawing Sheets

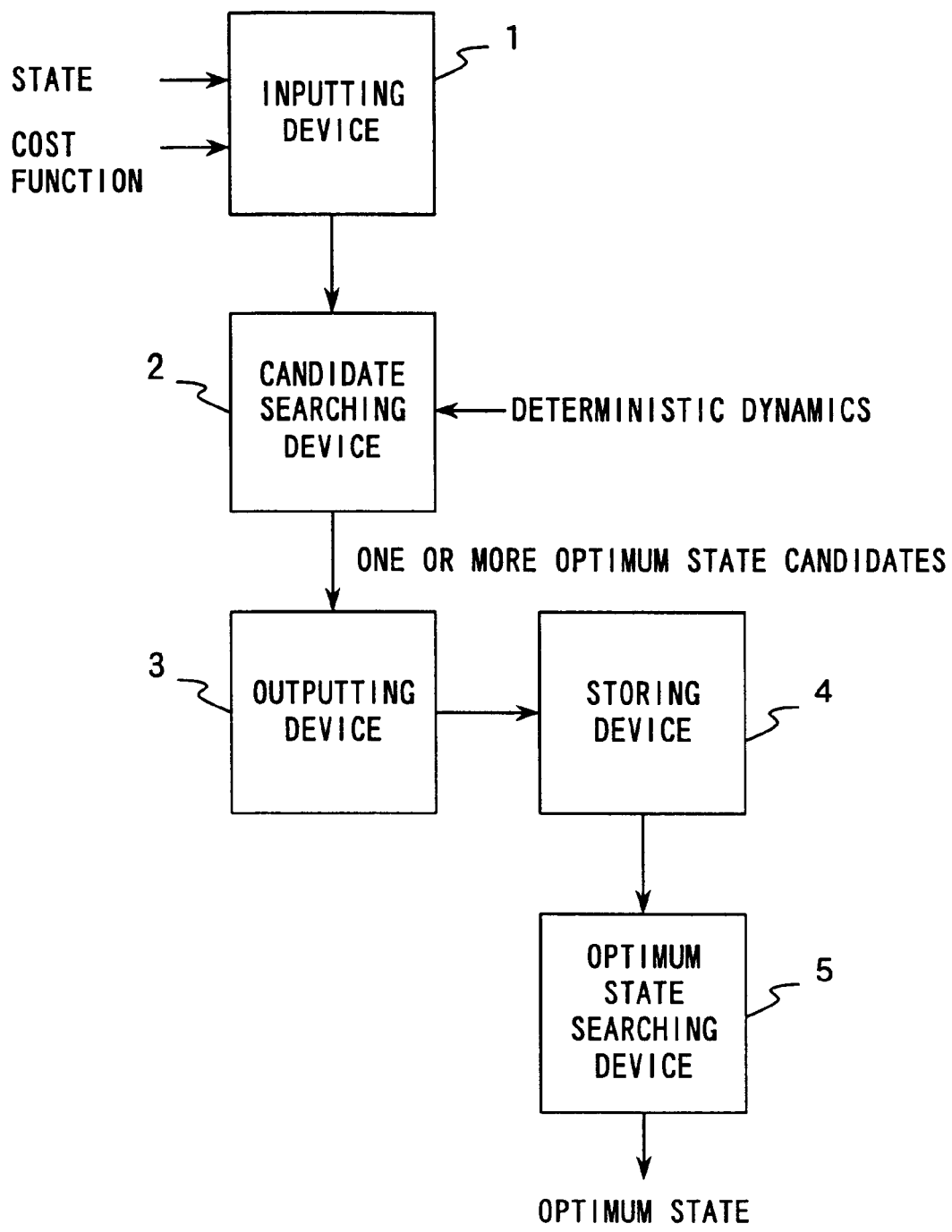
F I G. 1

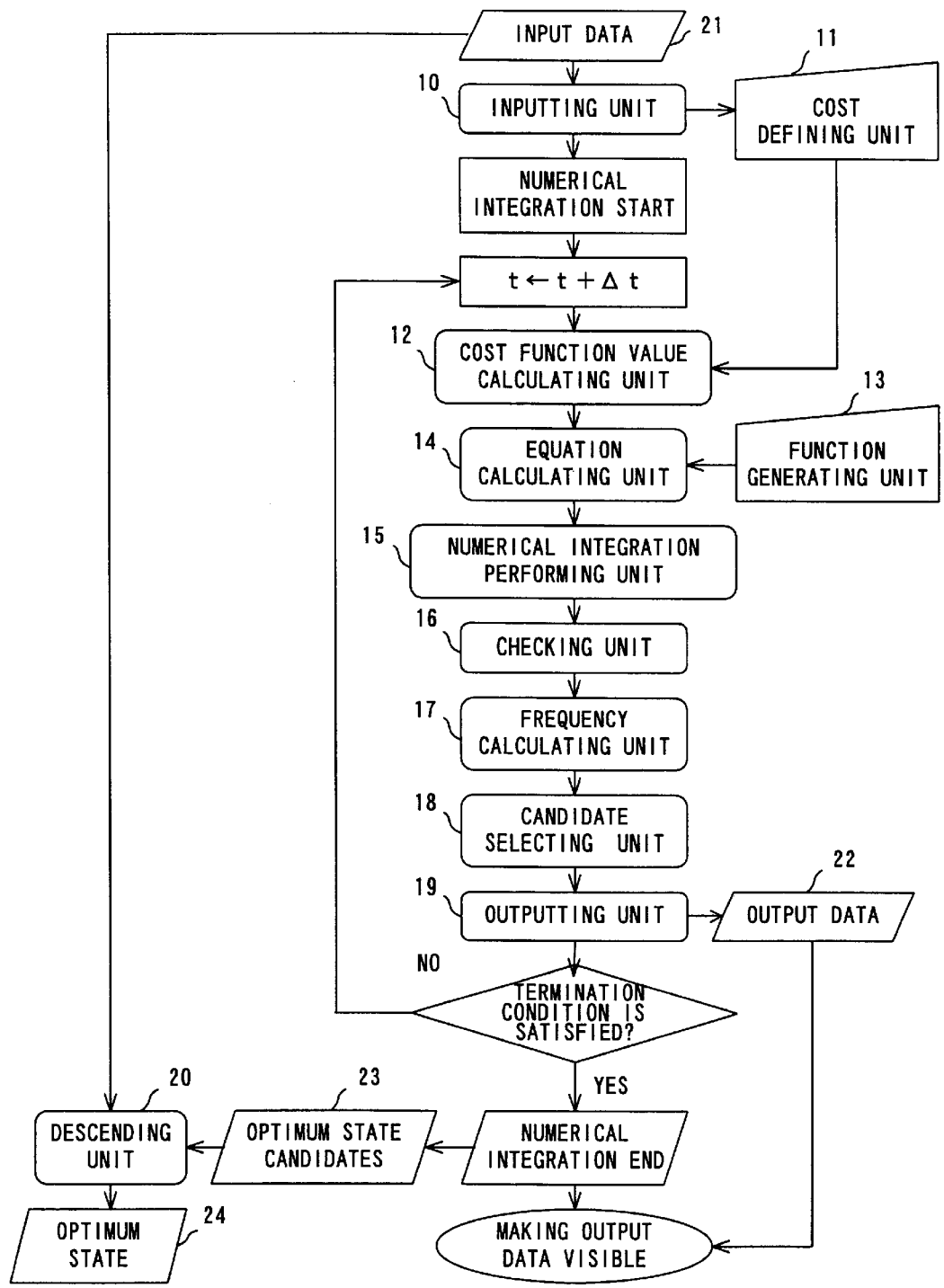
F I G. 2

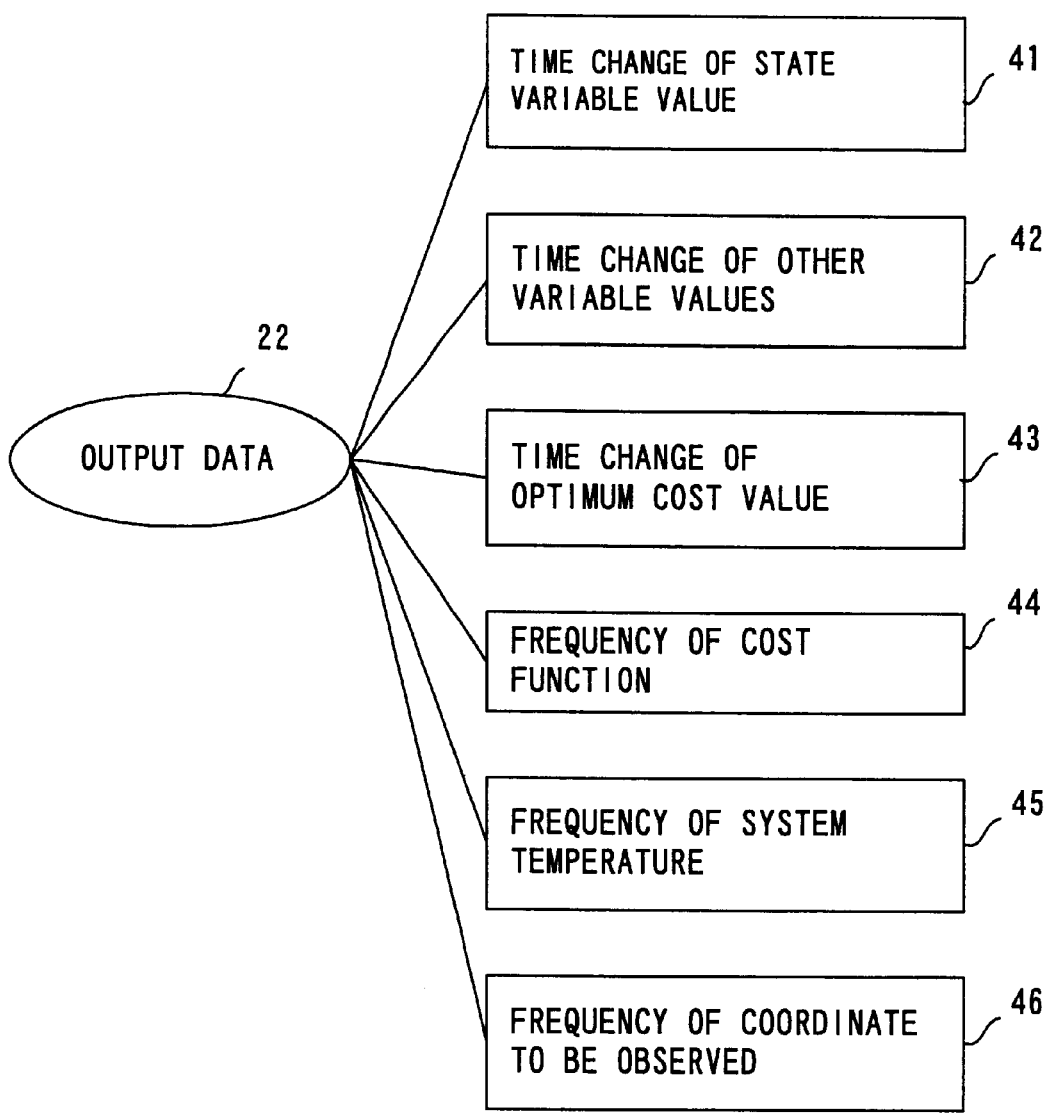
F I G. 4

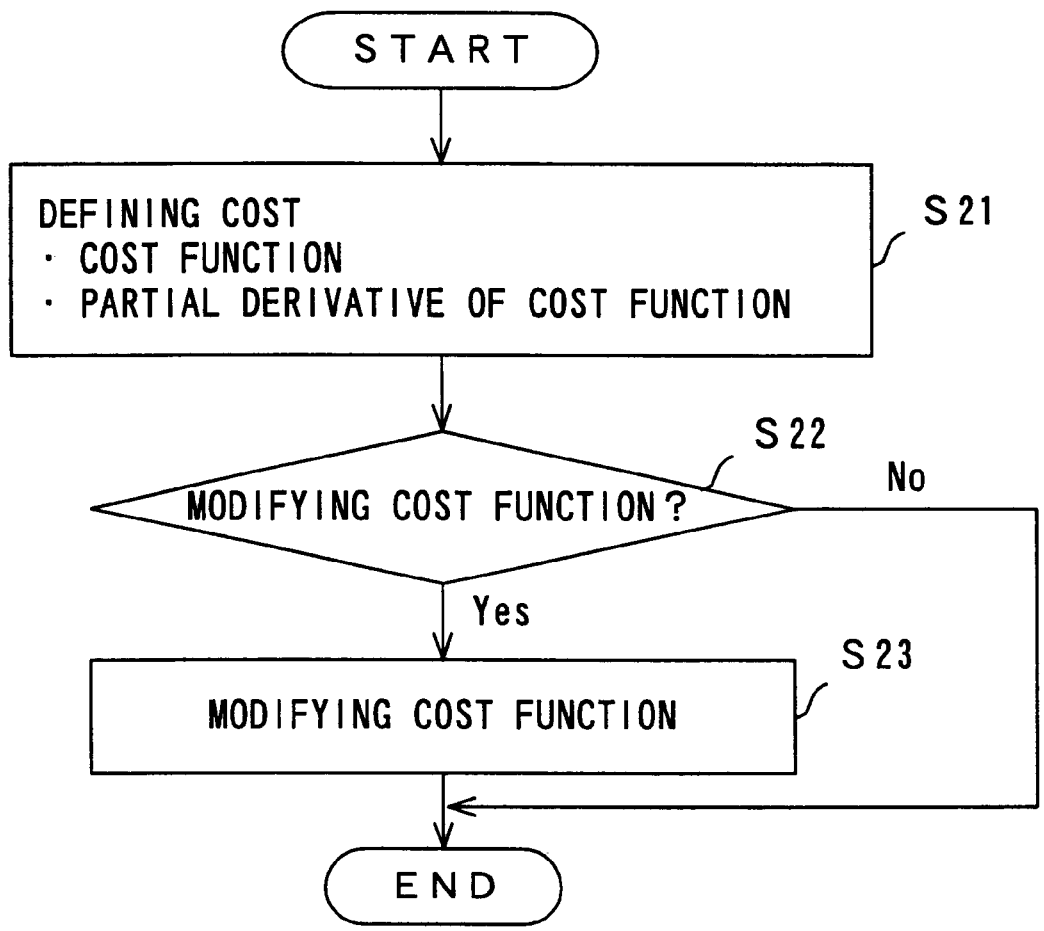
F I G. 6

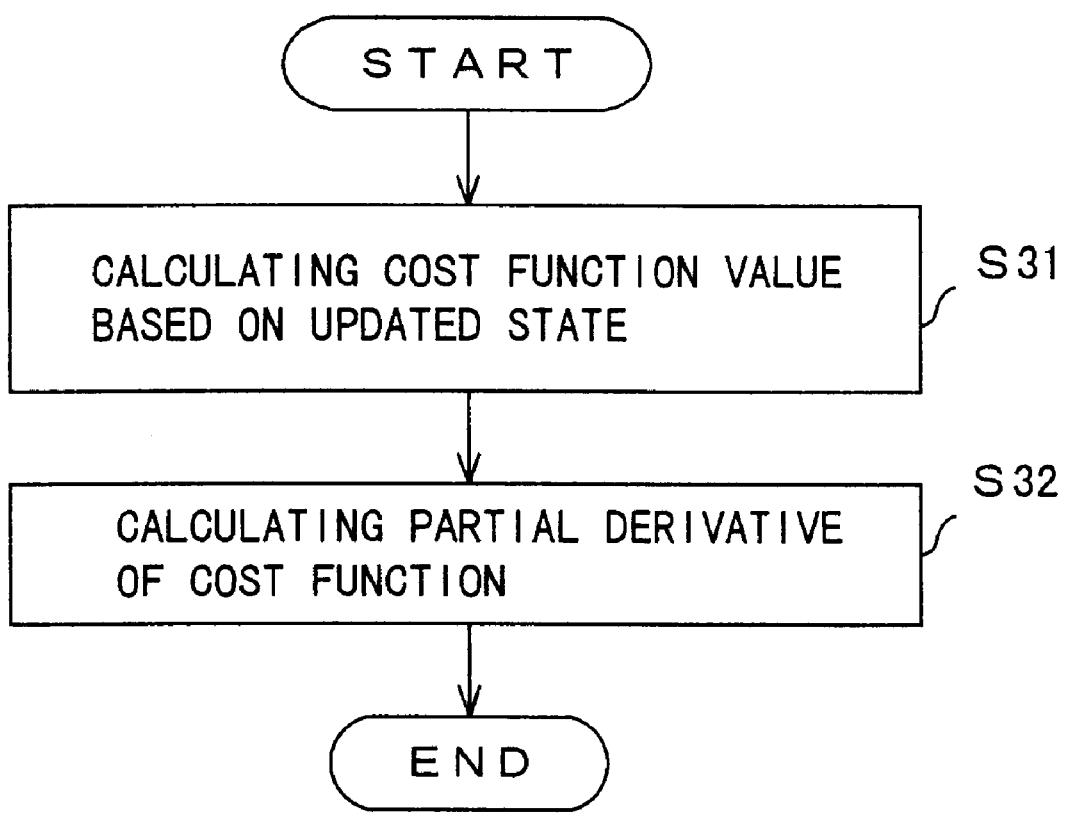
F I G. 7

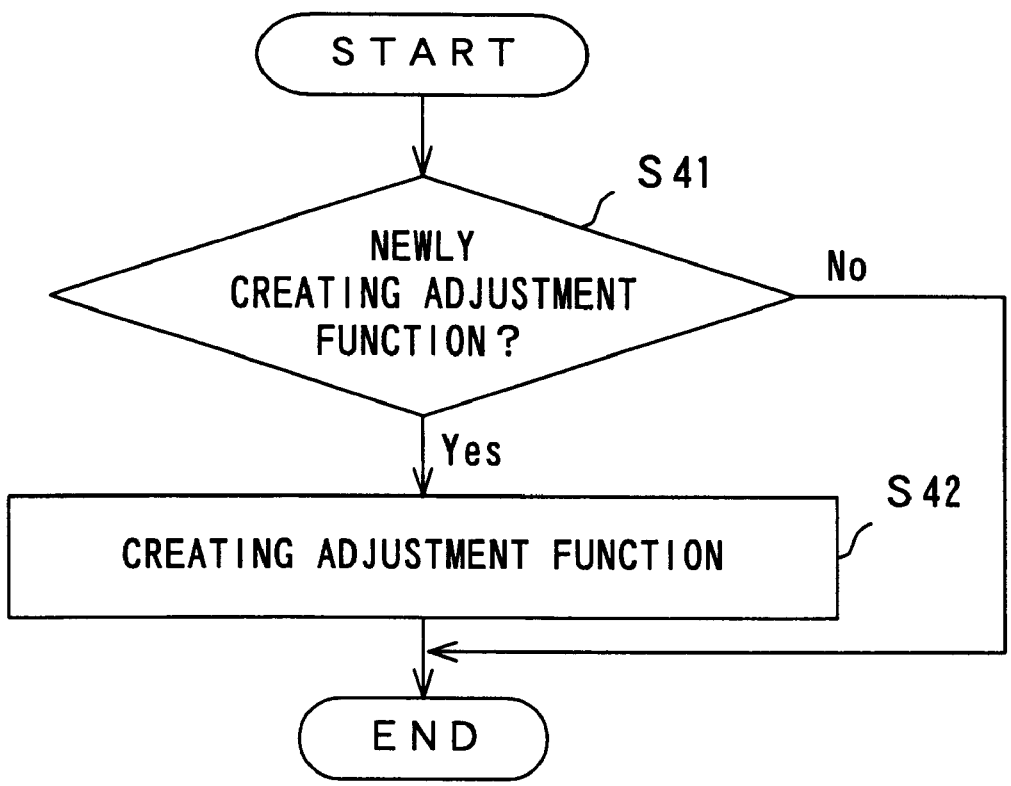
F I G. 8

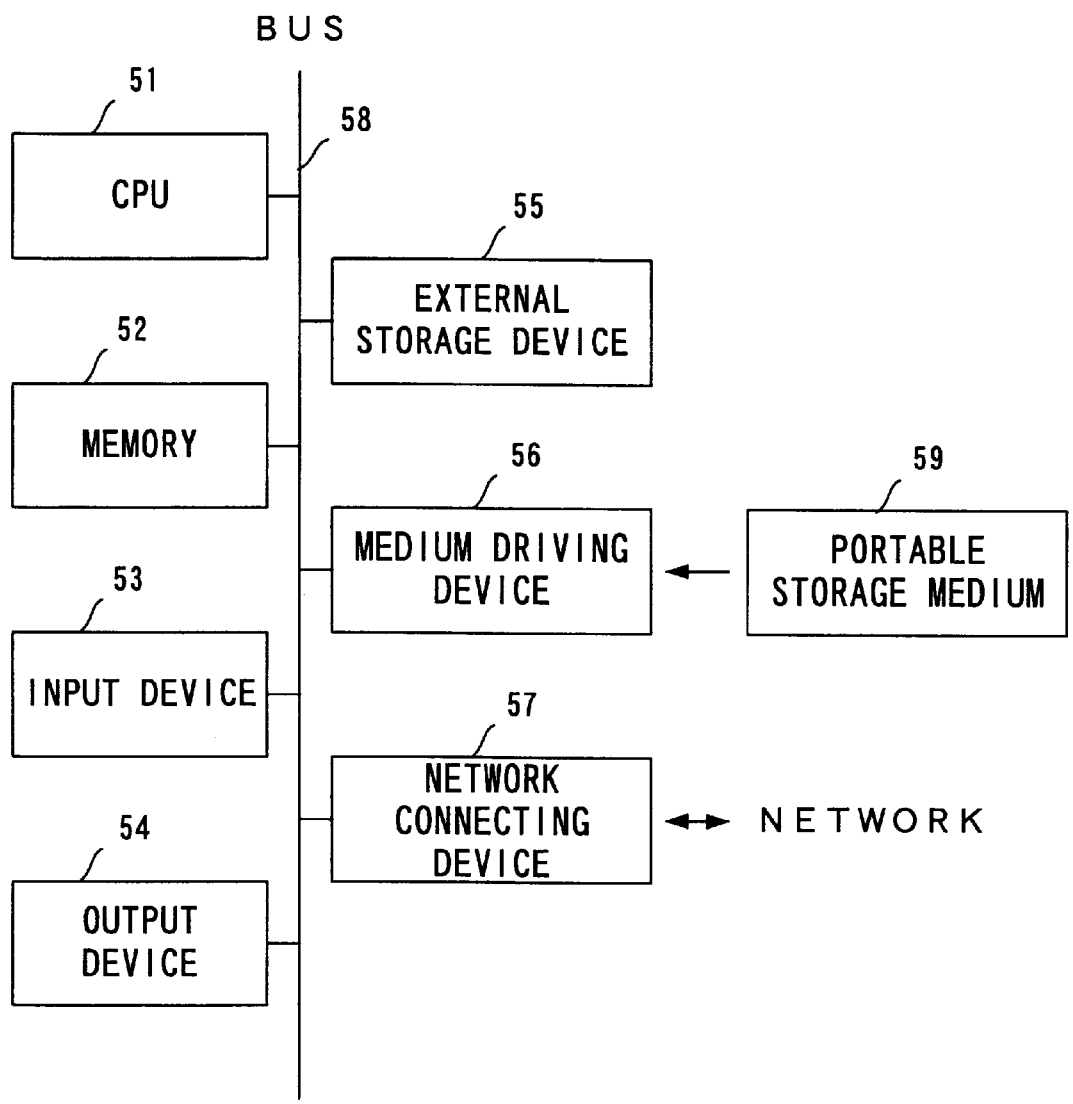
F I G. 1 7

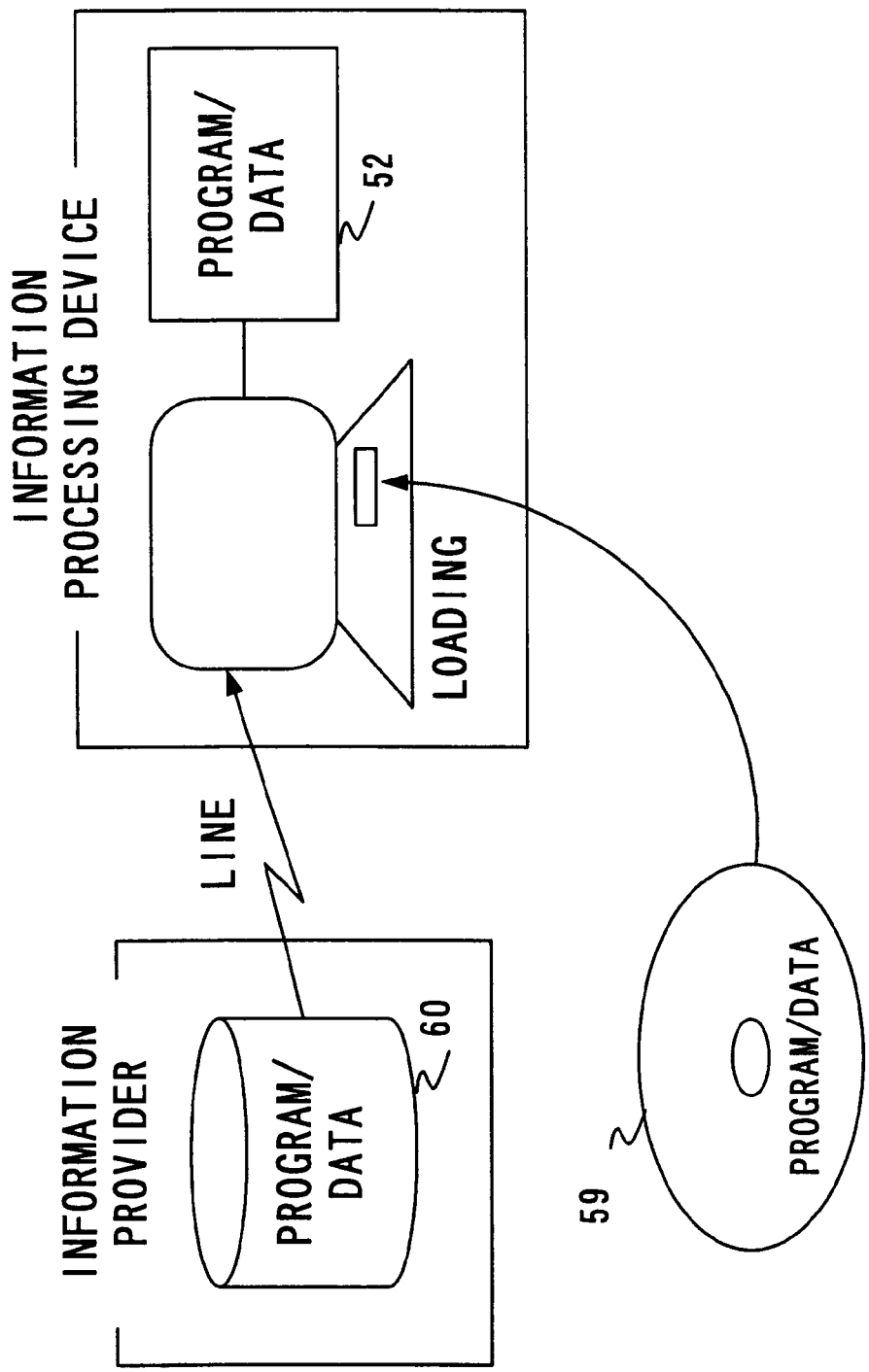
F I G. 1 8

```
C : ================================================================ :
C :                       M A I N   P R O G R A M
C : ================================================================ :
      IMPLICIT REAL*8 (A-H, O-Z)
      PARAMETER ( NFREE = 2 )
      PARAMETER ( NFINM  = 100002 )
      PARAMETER ( NFIN2M  = 102 )
      DIMENSION Q(NFREE),  P(NFREE), Z(2)
      DIMENSION QKD(NFREE), PKD(NFREE), ZKD(2)
      DIMENSION QK0(NFREE), PK0(NFREE), ZK0(2)
      DIMENSION QK1(NFREE), PK1(NFREE), ZK1(2)
      DIMENSION QK2(NFREE), PK2(NFREE), ZK2(2)
      DIMENSION QK3(NFREE), PK3(NFREE), ZK3(2)
      DIMENSION F(NFREE)
      DIMENSION DOSUU(NFINM, 2), RDR(2)
      DIMENSION DOSUU2(NFIN2M, NFIN2M, 2), R2DR(2)
      DIMENSION QMIN(NFREE)
      CHARACTER*4 JOBNAM
      COMMON / DEBCON /CHTHRT, IDEB
      COMMON / SIMCON / BOLCON, DT2, DT6, BETA
      COMMON / FUNCON / NUMFUNC
```

F I G.   2 7

```
C ----------------------------------------
C   DEFINITION OF INPUT DATA
C ----------------------------------------
      NUMFUNC= 1
      TEMP   = 1.D1.
      QMASS  = 1.D-3
      ALPHA1 = 0.D0
      ALPHA2 = 0.D0
      TEMP2  = 1.D1
      UEX    = 2
      DT     = 1.D-4
      IPBC   = 1

NSTEP  = 10000000
      NOUT   = 1000
      JOBNAM = 'J0041RETRY'
      UMIN   = 1.E10
      CHTHRT = 1.D-2
```

FIG. 28

```
C  --------------------------------------------------
C       DEFINITION OF CONSTANTS
C  --------------------------------------------------
        BOLCON = 1.D0
        DT2 = 0.5D0*DT
        DT6 = DT/6.D0
        BETA = NFREE*BOLCON*TEMP
```

FIG. 29

```
C ------------------------------------------------
C     DEFINITION OF INITIAL CONDITION
C ------------------------------------------------
      Q(1) = 0.D0
      Q(2) = 0.D0
      P(1) = DSQRT(BOLCON*TEMP)
      P(2) = 0.D0
      Z(1) = 0.D0
      Z(2) = 0.D0
```

FIG. 30

```
C ------------------------------------
C     PREPARATION FOR HISTGRAM
C ------------------------------------
C --- U(Q)
      DR1      = 1.D-3
      UINI     = 1.D0
      UFIN     = 15.D0
      RDR(1)   = 1.D0 / DR1
      NU       = (UFIN-UINI)*RDR(1) + 2
C --- K(P)
      DR2      = 1.D-3
      P2INI    = 0.D0
      P2FIN    = 5*TEMP
      RDR(2)   = 1.D0 / DR2
      NP2      = (P2FIN-P2INI)*RDR(2) + 2
C---   PAIQ
      D2R.1.   = 1.D-2
      QINI     = -5.D-1
      QFIN     = 5.D-1
      R2DR(1)  = 1.D0 / D2R1
      NQ       = (QFIN-QINI)*R2DR(1) + 2

NNN = MAX(NU, NP2)
          IF( NFINM  .LT. NNN ) THEN
            WRITE(6, *) '****NFINM.LT.MAX(NU,NP2)', NU,NP2
            STOP
          ENDIF
          IF( NFIN2M  .LT. NQ)THEN
            WRITE(6,*) '**** NFIN2M.LT.NQ',NQ
            STOP
          ENDIF
          DO 2010 IA=1,2
          DO 2010 I=1,NFINM
            DOSUU(I,IA)=0
 2010     CONTINUE
          DO 2020 IA=1,2
          DO 2020 J=1,NFIN2M
          DO 2020 I=1,NFIN2M
            DOSUU2(I,J,IA)=0
 2020     CONTINUE
          WRITE(40,700)
          WRITE(41,700)
          WRITE(42,700)
          WRITE(43,700)
  700     FORMAT( E15.7 )
```

F I G. 3 1

```
C  ------------------------------------------
C         CHECKING INITIAL DATA
C  ------------------------------------------
      WRITE(99, * ) '***JOBNAM =', JOBNAM
      WRITE(99, * ) '*********************'
      WRITE(99, * ) '***NFREE =', NFREE
      WRITE(99, * ) '***NSTEP =', NSTEP
      WRITE(99, * ) '***IPBC =', IPBC
      WRITE(99, * ) '***NOUT =', NOUT
      WRITE(99, * ) '***DT =', DT
      WRITE(99, * ) '***TEMP =', TEMP
      WRITE(99, * ) '***QMASS =', QMASS
      WRITE(99, * ) '***ALPHA1 =', ALPHA1
      WRITE(99, * ) '***ALPHA2 =', ALPHA2
      WRITE(99, * ) '***TEMP2 =', TEMP2
      WRITE(99, * ) '***UEX =', UEX
      WRITE(99, * ) '***NFINM =', NFINM
      WRITE(99, * ) '***NFIN2M =', NFIN2M
      WRITE(99, * ) '***Q =', Q
      WRITE(99, * ) '***P =', P
      WRITE(99, * ) '***Z =', Z
      WRITE(99, * ) '***DGR =', DGR
      WRITE(99, * ) '***NNR =', NNR
      WRITE(99, * ) '***BOLCON =', BOLCON
      WRITE(99, * ) '***RDR =', RDR
      WRITE(99, * ) '***UINI =', UINI
      WRITE(99, * ) '***UFIN =', UFIN
      WRITE(99, * ) '***P2INI =', P2INI
      WRITE(99, * ) '***P2FIN =', P2FIN
      WRITE(99, * ) '***QINI =', QINI
      WRITE(99, * ) '***QFIN =', QFIN
      WRITE(99, * ) '***R2DR =', R2DR
      WRITE(99, * ) '***CHTHRT =', CHTHRT
      WRITE(99, * ) '***UMIN =', UMIN
      IDEB = 1
      CALL COSTFUNC(QKD, U, F, NFREE)
      IDEB = 0
```

FIG. 32

```
C     ------------------------------------------
C        TIME LOOP CALC.
C     ------------------------------------------
      CALL    AMDYN  (Q, P, Z, F,
     .                QKD, QK0, QK1, QK2, QK3,
     .                PKD, PK0, PK1, PK2, PK3,
     .                ZKD, ZK0, ZK1, ZK2, ZK3,
     .                DT, QMIN, UMIN,
     .                QMASS, ALPHA1, ALPHA2, TEMP, TEMP2, UEX,
     .                RDR, DOSUU, NFINM, UINI, P2INI,
     .                R2DR, DOSUU2, NFIN2M, QINI,
     .                NFREE, NSTEP, NOUT, IPBC )
```

F I G. 3 3

```
C   ------------------------------------
C        WRITE HISTGRAM
C   ------------------------------------
C   --- NORMALIZATION
C           DO 2005 IA=1,2
C           DO 2005 I=1,NFINM
C               DOSUU(I,IA)=DOSUU(I,IA)/NSTEP
C   2005    CONTINUE

C   --- GNUPOT ERROR OCCUR WHEN NFINM LARGE(ABOUT40000)
         NGNU = MIN(NFINM, 30000)

DO 2000 I=1,NGNU
            WRITE(50,650) DOSUU(I,1)
2000     CONTINUE
         DO 2100 I=1,NGNU
            WRITE(51,650) DOSUU(I,2)
2100     CONTINUE
         NQ2    = (QFIN-QINI)*R2DR(1)
         DO 2120 J=1,NQ2
         DO 2130 I=1,NQ2
            WRITE(52,655)
            QINI+Q2R1*(I-1), QINI+D2R1*(J-1), DOSUU2(I,J,1)
2130     CONTINUE
         WRITE(52,610)
2120     CONTINUE

650      FORMAT( E15.7 )
655      FORMAT( 3E15.7 )
```

F I G. 3 4

```
C  ------------------------------------------------
C      WRITE POTENTIAL GRAPH AND ITS DERIVATIVE
C  ------------------------------------------------
          DGR = 1D-2
          NNR = 5.D-1/DGR
          DO 1000 J = -NNR, NNR
          DO 1010 I = -NNR, NNR
             QKD(1)= DGR* I
             QKD(2)= DGR* J
             CALL COSTFUNC(QKD, U, F, NFREE)
             WRITE(9, 600) QKD(1), QKD(2), U
             WRITE(8, 600) QKD(1), QKD(2), F(1)
             WRITE(7, 600) QKD(1), QKD(2), F(2)
 1010     CONTINUE
          WRITE(9, 610)
 1000     CONTINUE
 600      FORMAT( 3E15.7 )
 610      FORMAT( E15.7 )
```

F I G. 3 5

```
C  ----------------------------------------
C      USE DESCENT METHOD
C  ----------------------------------------
       CALL DESCENT (Q, NFREE)

STOP
       END
```

F I G. 3 6

```
C :================================================================
C :                    TIME LOOP CALCULATION
C :================================================================
      SUBROUTINE AMDYN(Q,P,Z,F,
     .                 QKD,QK0,QK1,QK2,QK3,
     .                 PKD,PK0,PK1,PK2,PK3,
     .                 ZKD,ZK0,ZK1,ZK2,ZK3,
     .                 DT,QMIN,UMIN,
     .                 QMASS, ALPHA1, ALPHA2, TEMP,TEMP2,UEX,
     .                 RDR,DOSUU,NFINM,UINI, P2INI,
     .                 R2DR,DOSUU2,NFIN2M,QINI,
     .                 NFREE,NSTEP,NOUT,IPBC )

IMPLICIT REAL*8  (A-H, O-Z)
      DIMENSION Q(NFREE), P(NFREE), Z(2)
      DIMENSION QKD(NFREE), PKD(NFREE), ZKD(2)
      DIMENSION QK0(NFREE), PK0(NFREE), ZK0(2)
      DIMENSION QK1(NFREE), PK1(NFREE), ZK1(2)
      DIMENSION QK2(NFREE), PK2(NFREE), ZK2(2)
      DIMENSION QK3(NFREE), PK3(NFREE), ZK3(2)
      DIMENSION F(NFREE)
      DIMENSION DOSUU(NFINM,2), RDR(2)
      DIMENSION DOSUU2(NFIN2M,NFIN2M,2), R2DR(2)
      DIMENSION QMIN(NFREE)
      COMMON / SIMCON / BOLCON, DT2, DT6, BETA
      COMMON / DEBCON / CHTHRT, IDEB

CALL COSTFUNC(Q,U,F,NFREE)
      P2 = 0.D0
      DO 102 I=1,NFREE
        P2 = P2 + P(I)*P(I)
  102 CONTINUE
      THITAU = 1.D0/BOLCON/TEMP2/UEX * U**UEX
      TAU = TEMP/TEMP2 * U**(UEX-1)

DO 100 NT=1,NSTEP
```

FIG. 37

```
C ------------------------------------------
C   NUMERICAL INTEGRATION:
C           4TH RUNGE-KUTTA METHOD
C ------------------------------------------
      CALL EQ1 (Q,P,Z, QK0,PK0,ZK0,F,
     .          QMASS, ALPHA1,ALPHA2, TEMP, TEMP2, UEX,
     .          NFREE, NSTEP )

DO 1000 I=1,NFREE
         QKD(I) = Q(I) + DT2 * QK0(I)
         PKD(I) = P(I) + DT2 * PK0(I)
1000  CONTINUE
      ZKD(1) = Z(1) + DT2 * ZK0(1)
      ZKD(2) = Z(2) + DT2 * ZK0(2)

CALL EQ1 (QKD,PKD,ZKD, QK1,PK1,ZK1,F,
     .          QMASS, ALPHA1, ALPHA2, TEMP, TEMP2, UEX,
     .          NFREE, NSTEP )

DO 1100 I=1,NFREE
         QKD(I) = Q(I) + DT2 * QK1(I)
         PKD(I) = P(I) + DT2 * PK1(I)
1100  CONTINUE
      ZKD(1) = Z(1) + DT2 * ZK1(1)
      ZKD(2) = Z(2) + DT2 * ZK1(2)

CALL EQ1 (QKD,PKD,ZKD, QK2,PK2,ZK2,F,
     .          QMASS, ALPHA1, ALPHA2, TEMP, TEMP2, UEX,
     .          NFREE, NSTEP )

DO 1200 I=1,NFREE
         QKD(I) = Q(I) + DT * QK2(I)
         PKD(I) = P(I) + DT * PK2(I)
1200  CONTINUE
      ZKD(1) = Z(1) +DT * ZK2(1)
      ZKD(2) = Z(2) +DT * ZK2(2)

CALL EQ1 (QKD,PKD,ZKD, QK3,PK3,ZK3,F,
     .          QMASS, ALPHA1, ALPHA2, TEMP TEMP2, UEX,
     .          NFREE, NSTEP )

DO 1300 I=1,NFREE
         Q(I) = Q(I)
     .        + DT6*(QK0(I)+2.D0*(QK1(I)+QK2(I))+ QK3(I))
         P(I) = P(I)
     .        + DT6*(PK0(I)+2.D0*(PK1(I)+PK2(I))+ PK3(I))
1300  CONTINUE
      Z(1) = Z(1)
     .     + DT6*(ZK0(1)+2.D0*(ZK1(1)+ZK2(1))+ ZK3(1))
      Z(2) = Z(2)
     .     + DT6*(ZK0(2)+2.D0*(ZK1(2)+ZK2(2))+ ZK3(2))
```

F I G. 3 8

```
C   ------------------------------------------
C      BOUNDARY CONDITION :
C        1. TORUS(T2)
C           CONDITION :  -0.5 < Q(I) < 0.5
C        2. ....
C   ------------------------------------------
        IF( IPBC .NE. 0 ) THEN
          DO 2000 I=1,NFREE
            Q(I)= Q(I) -DNINT(Q(I))
 2000     DONTINUE
        ENDIF
```

F I G.  3 9

```
C   ------------------------------------------
C           CALCULATE VARIABLES
C   ------------------------------------------
        CALL COSTFUNC(Q, U, F, NFREE)
        P2 =0.D0
        DO 101 I=1, NFREE
            P2 = P2 + P(I)*P(I)
101     CONTINUE
        THITAU = 1.D0/BOLCON/TEMP2/UEX * U**UEX
        TAU = TEMP/TEMP2 * U**(UEX-1)
```

FIG. 40

```
C ----------------------------------------
C    CALC. HISTGRAM
C ----------------------------------------
C --- U(Q)
        IR = ( U - UINI)*RDR(1) +1
        IF( ( IR .LE. 0) .OR. (IR .GT. NFINM) ) THEN
           WRITE(40,700) NT, IR, U
        ELSE
           DOSUU(IR,1)=DOSUU(IR,1)+1
        ENDIF
C --- K(P)
        IR = ( P2 - P2INI )*RDR(2) +1
        IF( ( IR .LE. 0) .OR. (IR .GT. NFINM) ) THEN
           WRITE(41,700) NT, IR, P2
        ELSE
           DOSUU(IR,2)=DOSUU(IR,2)+1
        ENDIF
C --- PAIQ
        IR1 = ( Q(1) - QINI )*R2DR(1) +1
        IR2 = ( Q(2) - QINI )*R2DR(1) +1
        IF( ( IR1 .LE. 0) .OR. (IR1 .GT. NFIN2M) ) THEN
            IF( IPBC .NE. 0)
               WRITE(42,700) NT,IR1,Q(1)
        ELSEIF
           ( ( IR2 .LE. 0) .OR. (IR2 .GT. NFIN2M) ) THEN
            IF(IPBC .NE. 0)
               WRITE(43,700) NT, IR2, Q(2)
        ELSE
           DOSUU2(IR1,IR2,1)=DOSUU2(IR1,IR2,1)+1
        ENDIF
 700    FORMAT( 2I10, E15.7 )
```

FIG. 41

```
C  ----------------------------------------
C      SELECT MINIMUM
C  ----------------------------------------
         IF ( U .LT. UMIN ) THEN
             UMIN = U
             DO 2100 I=1,NFREE
                 QMIN(I) = Q(I)
 2100        CONTINUE
         ENDIF
```

FIG. 42

```
C -----------------------------------------
C       DATA OUTPUT
C -----------------------------------------
            IF( MOD(NT, NOUT) .EQ. 0 ) THEN
                WRITE(10, 620)  Q(1), Q(2)
                WRITE(11, 620)  P(1), P(2)
                WRITE(12, 600)  Z(1)
                WRITE(13, 600)  Z(2)
                WRITE(16, 600)  U
                WRITE(17, 600)  P2/NFREE/BOLCON
                WRITE(18, 600)  U + 0.5D0*P2
                WRITE(20, 600)  THITAU
                WRITE(21, 600)  TAU
                WRITE(22, 600)  UMIN
                WRITE(31, 600)  Q(1)
                WRITE(32, 600)  Q(2)
                WRITE(33, 630)  Q(1), Q(2), U
                WRITE(60, 650)  Q(1)*50, Q(2)*50
600             FORMAT( E15.7)
610             FORMAT(5E15.7)
620             FORMAT(2E15.7)
630             FORMAT(3E15.7)
650             FORMAT(2E15.7 /)
            ENDIF

100     CONTINUE

RETURN
        END
```

F I G. 4 3

```
C : ================================================================:
C :                     EQUATION CALCULATION
C : ================================================================:
      SUBROUTINE EQ1 (Q,P,Z, QKD,PKD,ZKD,F,
     .                QMASS, ALPHA1, ALPHA2, TEMP, TEMP2, UEX,
     .                NFREE, NSTEP)

IMPLICIT REAL*8 (A-H, O-Z)
      DIMENSION Q(NFREE),P(NFREE),Z(2)
      DIMENSION F(NFREE)
      DIMENSION QKD(NFREE),PKD(NFREE),ZKD(2)
      COMMON / SIMCON / BOLCON, DT2, DT6, BETA
```

FIG. 44

```
C ----------------------------------------
C      CALC.  COST FUNCTION
C ----------------------------------------
       CALL COSTFUNC(Q, U, F, NFREE)
```

F I G. 4 5

```
C ------------------------------------------
C     CALC.  TEMPERATURE OF THE SYSTEM
C ------------------------------------------
      P2 =0.D0
      DO 100 I=1,NFREE
         P2 =P2 + P(I)*P(I)
100   CONTINUE
```

FIG. 46

```
C ------------------------------------------------
C     CALC.   RHS OF THE ODE
C ------------------------------------------------
         TAU = TEMP/TEMP2 * U**(UEX-1)
         CW = ALPHA1*ALPHA2* Z(2)
         ZCW = Z(1)+CW
         DO 1000 I=1, NFREE
            QKD(I) = P(I)
            PKD(I) = TAU*F(I)-ZCW*P(I)
1000     CONTINUE
         ZKD(1) = ( P2-BETA )/QMASS
         ZKD(2) = ( P2-BETA )*ALPHA1

RETURN
      END
```

F I G. 4 7

```
C : ==============================================================
C :                    COST FUNCTION CALCULATION
C : ==============================================================
      SUBROUTINE COSTFUNC(Q, U, F, NFREE)
      IMPLICIT REAL*8 (A-H, O-Z)
      DIMENSION Q(NFREE), F(NFREE)
      COMMON / DEBCON / CHTHRT, IDEB
      COMMON / FUNCON / NUMFUNC
```

FIG. 48

```
C     ----------------------------------------
C         GAUSSIAN FUNC PARAMETER
C     ----------------------------------------
      PARAMETER ( NSUM = 7 )
      DIMENSION B(NSUM), C(NSUM), D(2, NSUM)

GO TO (110, 120), NUMFUNC
C     ----------------------------------------
C         COST FUNCTION SELECTION
C         110:    7 GAUSSIANS
C         120:    SIN(X) * SIN(Y)
C         130:    .....
C     ----------------------------------------
```

FIG. 49

```
C ------------------------------------------
C       7 GAUSSIANS
C ------------------------------------------
  110      DO 1000 L = 1, NSUM
              B(L) = 2.D+2
 1000     CONTINUE
          C(1) = 10.0
          DO 1010 L = 2, NSUM
              C(L) = 8.0 - L
 1010     CONTINUE
          D(1,1) = -1.0D-1
          D(2,1) = -1.0D-1
          D(1,2) =  1.5D-1
          D(2,2) =  2.0D-1
          D(1,3) = -1.5D-1
          D(2,3) =  2.0D-1
          D(1,4) =  1.5D-1
          D(2,4) = -2.0D-1
          D(1,5) =  3.0D-1
          D(2,5) =  1.0D-1
          D(1,6) = -3.0D-1
          D(2,6) =  0.5D-1
          D(1,7) = -2.5D-1
          D(2,7) = -2.0D-1
          U = 0.D0
          DO 30 I = 1, NFREE
              F(I) = 0.D0
   30     CONTINUE
          DO 100 L =1, NSUM
              Q2 = 0.D0
              DO 200 I = 1, NFREE
                  Q2 = Q2 + (Q(I)-D(I,L))*(Q(I)-D(I,L))
  200         CONTINUE
              UFAC = -C(L)*DEXP(-B(L)*Q2 )
              U = U + UFAC
              DO 300 I =1, NFREE
                  F(I) =F(I) + 2.D0*B(L)*UFAC*(Q(I)-D(I,L))
  300         CONTINUE
  100     CONTINUE
C --- SHIFT(OPTION)------------------
          UINF = -C(1)
          DO 1100 L =2, NSUM
              UINF = DMIN1( UINF, -C(L) )
 1100     CONTINUE
          U = U - UINF + 1.5D0
C --- SHIFT(OPTION)------------------
          GOTO 2000
```

FIG. 50

```
C ------------------------------------------------
C     120:    SIN(X) * SIN(Y)
C ------------------------------------------------
 120  C1= 5.D0
      PI =4.D0*DATAN(1.D0)
      A1= 4.D0* PI
      A2= 4.D0* PI
      U = C1 *DSIN(A1*Q(1))*DSIN(A2*Q(2)) + C1
      F(1)= - A1*C1 *DCOS(A1*Q(1))*DSIN(A2*Q(2))
      F(2)= - A2*C1 *DSIN(A1*Q(1))*DCOS(A2*Q(2))
      GOTO 2000
```

F I G. 5 1

```
C  ------------------------------------------------
C           CHECKING INITIAL DATA
C  ------------------------------------------------
 2000 IF (IDEB .EQ. 1) THEN
      WRITE(99,*) ' ##### (COSTFUNC) #####'
      WRITE(99,*) ' ***NSUM  =', NSUM
      WRITE(99,*) ' ***NUMFUNC=', NUMFUNC
      WRITE(99,*) ' ***B   =', B
      WRITE(99,*) ' ***C   =', C
      WRITE(99,*) ' ***D   =', D
      WRITE(99,*) ' ***C1  =', C1
      WRITE(99,*) ' ***A1  =', A1
      WRITE(99,*) ' ***A2  =', A2
      ENDIF

RETURN
      END
```

F I G.  5 2

```
C : ================================================================;
C :                    DESCENT METHOD CALCULATION
C : ================================================================;
      SUBROUTINE DESCENT (Q, NFREE)
C     E. G.    USE AM METHOD
      RETURN
      END
```

FIG. 53

PROCESSING DEVICE SEARCHING FOR AN OPTIMUM VALUE OF A COST FUNCTION BY USING DYNAMICS

BACKGROUND OF THE INVENTION

1. Field of the Invention

The present invention relates to a processing device for searching for an optimum value of a cost function in an optimization problem such as an optimum structure problem, an optimum location problem, an optimum route problem, etc.

2. Description of the Related Art

In recent years, the demand for solving an optimization problem has been increasing in various industrial fields. The optimization problem is a problem of searching for a state where a given cost function becomes a maximum, a minimum, a local maximum, or a local minimum. By changing the sign of the cost function, the problem of obtaining a maximum or a local maximum is changed to a problem of obtaining a minimum or a local minimum. Hereinafter, the optimization problem will be described mainly as a problem of obtaining a minimum or a local minimum.

For example, in a CAD (Computer-Aided Design), an evaluation value of intensity or stability is used as a cost function in order to improve the intensity of a building, a construction, etc., and the stability to an external force, and the structure corresponding to its optimum value is then obtained. Additionally, in a material design, the energy of an atomic/molecular level of a material is used as a cost function, and the structure corresponding to the lowest energy state is obtained. Also in a more general parameter fitting problem, a parameter combination which makes a cost optimum is obtained.

As the conventional methods for solving such optimization problems, there are two methods such as a descent method and a probabilistic method. A steepest descent method being a representative of the descent method is a method which calculates from a given state a direction where the value of a cost function drops, changes the state in the calculated direction, and obtains one candidate of the minimum value of the cost function. In this way, the local minimum value of the cost function can be obtained.

Additionally, algorithms representative of the probabilistic method include a random method, an SA (Simulated Annealing) method, and a GA (Genetic Algorithm) method.

The random method is a method which selects a state at random, and picks up a state where the value of a cost function is small. The SA method adopts a metropolis algorithm so as to determine a next state. According to this algorithm, if the cost of the next state drops, that state is adopted. If the cost rises, the state is adopted with a certain probability. This probability depends on a temperature parameter. The metropolis algorithm is used by setting a temperature somewhat high at first. Thereafter, the temperature is gradually lowered.

The GA method is an optimization method which simulates the mechanism of the evolution of living things. This method represents a state as a character string which is referred to as a chromosome, and optimizes respective genes by performing genetic operations such as selection, crossing-over, mutation, etc. for a chromosome aggregation.

However, the above described conventional methods have the following problems.

With the steepest descent method, if the state where a cost function becomes a local minimum is found during a search, the search falls into a trap and cannot get out of that state. Accordingly, the state where the cost function is the minimum cannot be necessarily found. The random method has a possibility that a strict solution can be found if the number of states is finite and small. However, if the number of states becomes large, this method does not work well.

With the SA method, a temperature must be lowered in order to improve a realization probability of a low cost value state according to the metropolis algorithm, which leads to a slow state change for a search. Accordingly, once the search is trapped into a local minimum state, it is impossible to get out of this state without waiting for a long time. Accordingly, the method for setting a temperature high at first, and for lowering the temperature gradually is considered to be effective. However, there is no deterministic and general implementation of this temperature scheduling method, and how to arrange a temperature schedule becomes a problem.

Furthermore, since the GA method is lack of a neighborhood search capability, it cannot find a more optimum state if it exists in a neighborhood, which frequently causes a near miss. Still further, a theoretical proof that an optimum state can be found is insufficient.

SUMMARY OF THE INVENTION

An object of the present invention is to provide a processing device for efficiently searching for an optimum value of a cost function regardless of its local form.

In a first aspect of the present invention, a processing device comprises an inputting device, a candidate searching device, and an outputting device.

The inputting device inputs a state where a problem is described, and information of a cost function giving the cost of the state. The candidate searching device obtains one or more candidates of an optimum state by using deterministic dynamics which generates a realization probability that takes a higher value at a state that attains a more optimum value of the cost function. The outputting device outputs the obtained candidates.

In a second aspect of the present invention, a processing device comprises an inputting device, a defining device, a setting device, a calculating device, and an outputting device.

The inputting device inputs a parameter. The defining device defines a cost function which gives a state cost. The setting device sets an adjustment a function. The calculating device numerically solves a differential equation, which is described by the parameter, the cost function, and the adjustment function, in terms of a value, and obtains one or more candidates of an optimum state. The outputting device makes an obtained calculation result visible, and presents it to a user.

BRIEF DESCRIPTION OF THE DRAWINGS

FIG. 1 is a block diagram showing the principle of a processing device according to the present invention;

FIG. 2 shows the configuration of the processing device;

FIG. 4 shows output data;

FIG. 6 is a flowchart showing the process performed by a cost defining unit;

FIG. 7 is a flowchart showing the process performed by a cost function value calculating unit;

FIG. 8 is a flowchart showing the process performed by a function generating unit;

FIG. 17 is a block diagram showing the configuration of an information processing device;

FIG. 18 shows storage media;

FIG. 27 shows first program code;

FIG. 28 shows second program code;

FIG. 29 shows third program code;

FIG. 30 shows fourth program code;

FIG. 31 shows fifth program code;

FIG. 32 shows sixth program code;

FIG. 33 shows seventh program code;

FIG. 34 shows eighth program code;

FIG. 35 shows ninth program code;

FIG. 36 shows tenth program code;

FIG. 37 shows eleventh program code;

FIG. 38 shows twelfth program code;

FIG. 39 shows thirteenth program code;

FIG. 40 shows fourteenth program code;

FIG. 41 shows fifteenth program code;

FIG. 42 shows sixteenth program code;

FIG. 43 shows seventeenth program code;

FIG. 44 shows eighteenth program code;

FIG. 45 shows nineteenth program code;

FIG. 46 shows twentieth program code;

FIG. 47 shows twenty-first program code;

FIG. 48 shows twenty-second program code;

FIG. 49 shows twenty-third program code;

FIG. 50 shows twenty-fourth program code;

FIG. 51 shows twenty-fifth program code;

FIG. 52 shows twenty-sixth program code; and

FIG. 53 shows twenty-seventh program code.

DESCRIPTION OF THE PREFERRED EMBODIMENTS

Figure 3:
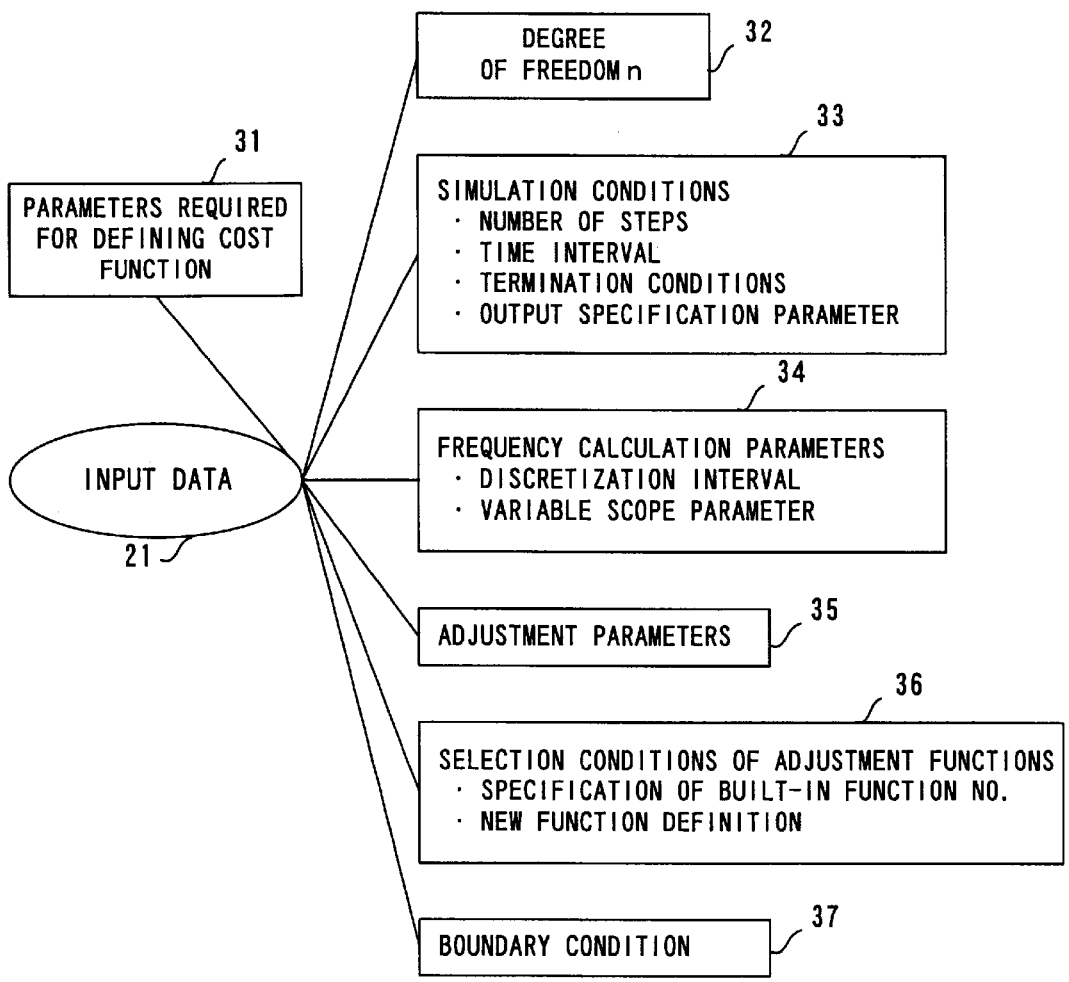
FIG. 3 shows input data.

Preferred embodiments according to the present invention will be hereinafter described in detail, by referring to the drawings.

FIG. 1 is a block diagram showing the principle of a processing device according to the present invention. The processing device shown in this figure comprises an inputting device 1, a candidate searching device 2, and an outputting device 3.

The inputting device 1 inputs a state where a problem is described, and the information of a cost function giving the cost of the state. The candidate searching device 2 obtains one or more candidates of an optimum state by using deterministic dynamics which generates a realization probability that takes a higher value at a state that attains a more optimum value of the cost function. The outputting device 3 outputs the obtained candidates.

The candidate searching device 2 determines a set of variables representing a state and the calculation algorithm of dynamics by using the information input by the inputting device 1, and makes calculations according to the set of variables and the calculation algorithm. Then, the candidate searching device 2 obtains a set of variable values which will become an optimum state candidate corresponding to the optimum value of the cost function. The outputting device 3 outputs candidates obtained by the candidate searching device 2 as a search result.

Dynamics corresponds to time development of a coordinate (point) generated by a calculation based on an equation, etc. By performing the dynamics in a state space where a state is defined by coordinate variables, the whole of a given state space can be searched under an appropriate condition, so that the search is never trapped by a local minimum of a cost function, etc. Accordingly, calculations can be made regardless of a local form of a cost function.

Additionally, with the dynamics which generates a realization probability that takes a higher value at a state that attains a more optimum value of a cost function, the neighborhood of the optimum states can be searched well without decreasing a system temperature. Accordingly, there is no need to retard a state change in order to generates the realization probability that takes a higher value at a state that attains a more optimum value of the cost function unlike the conventional probabilistic method, thereby increasing processing efficiency.

As described above, the point of the present invention is to search for an optimum state by using the deterministic dynamics which generates a realization probability that takes a higher value at a state that attains a more optimum value of a cost function.

The processing device shown in FIG. 1 further comprises a storing device 4 and an optimum state searching device 5. The storing device 4 stores one or more candidates obtained by the candidate searching device 2. The optimum state searching device 5 obtains a state closer to the optimum state by changing the respective states of the stored candidates in the direction where the value of a cost function is improved.

The calculation made by the optimum state searching device 5 corresponds to, for example, a calculation of a descent method, and can obtain the state of a cost value closer to the, optimum value than the state of a candidate. By obtaining the state with the best cost value among the states thus obtained, a solution with high precision can be obtained.

For example, the inputting device 1 shown in FIG. 1 corresponds to an inputting unit 10 and an inputting device 53, which are respectively shown in FIGS. 2 and 17 and will be described later, and the candidate searching device 2 shown in FIG. 1 corresponds to a cost function value calculating unit 12, an equation calculating unit 14, a numerical integration performing unit 15, a frequency calculating unit 17, and a candidate selecting unit 18, which are shown in FIG. 2. Additionally, for example, the outputting device 3 shown in FIG. 1 corresponds to an outputting unit 19 and an outputting device 54, which are respectively shown in FIGS. 2 and 17, the storing device 4 corresponds to a memory 52 shown in FIG. 17, and the optimum state searching device 5 shown in FIG. 1 corresponds to a descending unit 20 shown in FIG. 2.

In this preferred embodiment, the minimum value of a cost function U(q) which is determined by a state $q=(q_1,\ldots,q_n)$ represented by "n" real variables, and its state $q_{min}$ (or a value closer to the minimum value and its state) are searched. Note that U(q) is defined to be a function which is differentiable. By changing the sign of the cost function U(q), the problem of searching for the minimum value can be changed to the problem of searching for the maximum value. Here, the calculation having the following natures is aimed to be implemented.

(A) Having a neighborhood search capability.
(B) Not being trapped even if a local minimum state is found during a search.
(C) Enabling the realization probability of the state of a low cost value to be improved by setting parameters and adjustment functions. Furthermore, a search is prevented from slowing down like the SA method.
(D) Being given a theoretical proof that an optimum state can be found, covering how the realization probability of each state reaches after sufficiently long time and which conditions are required.

To implement such aims, several candidates of $q_{min}$ are first obtained by using deterministic dynamics. Then, $q_{min}$ or a state that takes a value closer to the minimum value is obtained by changing the states of the respective candidates with a descent method.

Here, the following ordinary differential equations are used as an example of the deterministic dynamics with which the candidates of $q_{min}$ are obtained.

$$dq_i/dt = -(\beta/n)\tau_K(p)p_i + (\beta/n)[B_i(x)\partial\Theta_Z(\zeta,w)/\partial w - \partial B_i(x)/\partial w](i=1,\ldots,n) \quad (1)$$

$$dp_i/dt = (\beta/n)\tau_U(q)F_i(q) - (\beta/n)[(1/Q)\partial\Theta_Z(\zeta,w)/\partial\zeta + \alpha\partial\Theta_Z(\zeta,w)/\partial w]$$
$$p_i(i=1,\ldots,n) \quad (2)$$

$$d\zeta/dt = [-(\beta/n)\tau_K(p)K(p) - \beta]/Q + (\beta/n)[A(x)\partial\Theta_Z(\zeta,w)/\partial w - \partial A(x)/\partial w] \quad (3)$$

$$dw/dt = [-(\beta/n)\tau_K(p)K(p) - \beta]\alpha - (\beta/n)[A(x)\partial\Theta_Z(\zeta,w)/\partial\zeta - \partial A(x)/\partial\Theta] + (\beta/n)\Sigma[\tau_U(q)F_i(q)B_i(x) + \partial B_i(x)/\partial q_i] \quad (4)$$

Notice that the following definitions are used here.

$$\Sigma \equiv \sum_{i=1}^{n}$$

$$q \equiv (q_1,\ldots,q_n) \in D \subset R^n \quad (5)$$

$$p \equiv (p_1,\ldots,p_n) \in R^n \quad (6)$$

$$x \equiv (q,p,\zeta,w) \in \Gamma \equiv D \times R^n \times R^2 \quad (7)$$

$$U: R^n \supset D \to R \quad (8)$$

$$F_i(q) = -\partial U(q)/\partial q_i \quad (9)$$

$$\tau_U(q) = [d\Theta_U(u)/du]_{u=U(q)} \quad (10)$$

$$K(p) = \Sigma p_i^2 \quad (11)$$

$$\tau_K(p) = 31\ 2[d\Theta_K(k)/dk]_{k=K(p)} \quad (12)$$

$$\Theta_U: R \supset D_U = U(D) \to R \quad (13)$$

$$\Theta_K: [0,\infty) \to R \quad (14)$$

$$\Theta_Z: R^2 \to R \quad (15)$$

$$A: \Gamma \to R \quad (16)$$

$$B = (B_1,\ldots,B_n): \Gamma \to R^n \quad (17)$$

The ordinary differential equations (1) through (4) correspond to equations extended from Newton equations. It is supposed that "$q_i$" is a coordinate and, "$p_i$" corresponds to a momentum. Additionally, "$\zeta$" and "w" are introduced as extended variables. "$\Theta_U$", "$\Theta_K$", "$\Theta_Z$", "A", and "B" are smooth functions which are introduced as adjustment functions, while "$\beta$", "Q", and "$\alpha$" are introduced as adjustment parameters. "$\beta$" serves as a set temperature. These adjustment functions and parameters can be arbitrarily set. At this time, the equations (1) through (4) have the following characteristics.

The left side of the equation (2) represents a time change in momentum, and "$F_i(q)$" in the first term on the right side represents a force obtained by attaching a negative sign to the differentiation of a cost function. In other words, the direction of a state change (direction of an acceleration) includes the component of the differentiation of the cost function with the reverse sign. Accordingly, if the cost function increases, the state changes in the direction reverse thereto. If the cost function decreases, the state changes in that direction. As described above, the equation (2) represents the nature in which if a local minimum exists, an approach is made to that direction, and has the nature described in (A).

Furthermore, the second term on the right side of the equation (2) represents a frictional force which is proportional to "$p_i$", and the coefficient of "$p_i$" described by $\Theta_Z(\zeta,w)$ corresponds to a frictional coefficient. The left side of the equation (3) represents a time change of "$\zeta$", the first term—$(\beta/n)\tau_K(p)K(p)$ in the first term on the right side represents system temperature, and K(p) represents the kinetic energy of the system.

Here, assume that $\partial\Theta_Z(\zeta,w)/\partial\zeta$ is an increasing function of "$\zeta$", the system temperature exceeds the set temperature "$\beta$" and the time change of "$\zeta$" becomes positive. In this case, the frictional force on the right side of the equation (2) increases and the momentum decreases, so that the system temperature drops. Inversely assume that the system temperature becomes lower than the set temperature "$\beta$", and the time change of "$\zeta$" becomes negative. In this case, the frictional force on the right side of the equation (2) decreases and the momentum increases, so that the system temperature rises. The frictional force in the equation (2) may be of a positive or a negative value.

Accordingly, the equations (2) and (3) represent the nature which attempts to make the system temperature approach the set temperature "$\beta$". Actually, it can be proved that the time average of the system temperature becomes "$\beta$" under a suitable condition. Therefore, if thermal vibrations are given to the system by making an adjustment such as a setting of "$\beta$" to a large value, it becomes possible to get out of a local minimum state. As described above, the equations (2) and (3) have the above described nature (B).

Furthermore, if some conditions which are considered to be satisfied in normal cases are satisfied, the probability that U(q) takes a value between "u1" and "u2" after a long time (theoretically, an infinite time) elapses can be represented by the adjustment function $\Theta_U$ which generates $\tau_U(q)$ in the equation (2). To be more specific, if the system has ergodicity, it can be proved that this probability is given by the following equation under an additional mathematical condition.

$$\lim_{\tau \to \infty} \frac{1}{\tau} \int_0^\tau \chi_S(T_t(x)) dt = \int_{u1}^{u2} k u(u) \Omega(u) du \quad (18)$$

$$S \equiv \{q \in D | u1 \leq U(q) \leq u2\} \times R^{n+2} \quad (19)$$

$$k_U(u) = \exp[-\Theta_u(u)] \quad (20)$$

Here, the left side of the equation (18) represents a limiting value of the definite integral with respect to time "t", while its right side represents the definite integral with respect to the value "u" of the cost function U(q). $T_t(x)$ on the left side represents the time development (flow) of a coordinate "x", and $\chi_s(x)$ is a function which becomes "1"if "x" is an element of a set "S", and becomes "0" if "x" is not an element of the set "S".

Additionally, $\Omega$ on the right side is a function which represents the density of the number of states of the cost function. $k_U(u)\Omega(u)$ represents the probability density with which the cost value U(q) of the system becomes "u". The probability represented by the equation (18) represents the ratio of the time period during which the system remains in a state where U(q) takes a value in a range between "u1" and "u2". This probability may be referred to also as a visit frequency of an orbit to that range.

The equation (18) is proved from the fact that the system has an invariant measure given by the density function ρ(x) in the following equation under a suitable condition.

$$\rho(x) = \exp[-\{\Theta_U(U(q)) + \Theta_K(K(p)) + \Theta_Z(\zeta, w)\}] \quad (21)$$

where ρ(x) represents the probability density with which the state of x=(q, p, ζ, w) is realized.

To implement the above described nature (C), "$k_U$" may be set so that "$k_U\Omega$" in the equation (18) becomes a maximum in the neighborhood of the minimum value of "u". The density function $\Omega$ rapidly increases with the increase of "u" in normal cases. Therefore, if "$k_U$" is suitably set, for example, as a function which rapidly decreases with the increase of "u", it is possible to make the peak of "$k_U\Omega$" approach the minimum value of "u". To make the function "$k_U$" rapidly decrease, $\Theta_U$ may be made to rapidly increase. As a result, the visit frequency of the state of a low cost value can be improved after a long time elapses.

Because the function "$k_U$" can be set independently of the set temperature "β" which determines the proceeding speed (that is, the search speed) of the system, it is theoretically guaranteed to prevent the search speed from degrading while increasing the realization probability of a state of a low cost value. Accordingly, the search speed does not slow down as a result of dropping the temperature in order to increase the realization probability of the state of a low cost value, unlike the conventional SA method. As described above, the equation (2) has the above described natures (C) and (D).

In other words, examples of the ordinary differential equations having the invariant measure which realizes the probability represented by the equation (18) are the equation (1) through (4). The equations (1) through (4) have an advantage to flexibly cope with an individually given problem by suitably setting the adjustment parameters and functions. However, the dynamics which realizes the probability represented by the equation (18) is not limited to the equations (1) through (4), and may be implemented as a different equation. For example, the number of extended variables to be introduced is not required to be two ("ζ" and "w") in all cases.

Explained next is the processing device which searches for an optimum value of a cost function by using the equations (1) through (4). This processing device is configured, for example, by using a computer. This device solves the equations (1) through (4) with a suitable numerical integration method, and obtains candidates of $q_{min}$. Normally, however, convergence into an optimum solution is not guaranteed. Therefore, the processing device terminates a search by setting a suitable termination condition. Then, the device descends the cost value with a suitable descent method by using the respectively obtained candidates of $q_{min}$ as initial values, and obtains a more optimum state.

FIG. 2 shows the configuration of such a processing device. The processing device shown in this figure comprises an inputting unit 10, a cost defining unit 11, a cost function value calculating unit 12, a function generating unit 13, an equation calculating unit 14, a numerical integration performing unit 15, a checking unit 16, a frequency calculating unit 17, a candidate selecting unit 18, an outputting unit 19, and a descending unit 20.

The inputting unit 10 inputs input data 21. The cost defining unit 11 sets a cost function and its partial derivative. The cost function value calculating unit 12 calculates the value of the function set by the cost defining unit 11 at a time "t". The function generating unit 13 generates a new adjustment function depending on need. The equation calculating unit 14 performs the calculations of the equations (1) through (4) at the time "t" by using the information from the cost function value calculating unit 12 and the function generating unit 13. The numerical integration performing unit 15 performs numerical integration by using the results of the calculations made by the equation calculating unit 14. The checking unit 16 checks the result of the integration.

The frequency calculating unit 17 calculates the realization frequencies of a cost function "U", kinetic energy "K" (temperature), a coordinate value "$q_{obs}$" to be observed, etc. The candidate selecting unit 18 selects candidates of an optimum state "$q_{min}$" based on these frequencies. The outputting unit 19 outputs as output data 22 the result of the integration and that of the calculations made by the frequency calculating unit 17 to a file.

The numerical integration performing unit 15 checks whether or not a termination condition is satisfied. If the termination condition is not satisfied, the numerical integration performing unit 15 advances the time "t" by Δt, and performs the next integration. Thereafter, if the termination condition is satisfied, the numerical integration performing unit 15 terminates the integration.

Then, the output data 22 is made visible on a display screen, and the plurality of obtained optimum state candidates 23 are passed to the descending unit 20. The descending unit 20 searches for "$q_{min}$" with a descent method based on input data 21 and the optimum state candidates 23, and outputs the obtained state as an optimum state 24. Also the optimum state 24 can be made visible on the display screen.

In FIG. 2, the numerical integration performing unit 15, the checking unit 16, the frequency calculating unit 17, the candidate selecting unit 18, the outputting unit 19, and the descending unit 20 have universal capabilities which do not depend on a given problem.

FIG. 3 shows the input data 21. In this input data 21, parameters 31 are parameters required for defining a cost function, and degree of freedom 32 is the number "n" of state variables which describe a given problem.

Additionally, simulation conditions 33 include the number of steps, a time interval, termination conditions, an output specification parameter, etc. The number of steps represents the number of times that the numerical integration and the descent method are repeated. The time interval represents an interval Δt of the numerical integration. The termination conditions represent the termination conditions of the numerical integration and the descent method. The output specification parameter is a parameter which specifies the output interval of the output data 22, etc. As the termination conditions, for example, the following conditions are used.

(a) Terminating the calculation when the calculation time or the number of processing steps reaches a predetermined value.
(b) Terminating the calculation when states of a cost value which is lower than a predetermined target value of U(q), the number of which is predetermined number or more, are obtained.

Furthermore, frequency calculation parameters 34 include a discretization interval, a variable scope parameter, etc. The discretization interval represents an interval between values when the realization frequency of the value of a given variable or function is calculated. The variable scope parameter represents the calculation range of the value of the variable or function.

Still further, adjustment parameters 35 are the values of the above described parameters "β", "Q" and "β". Selection conditions of the adjustment functions 36 are the conditions for setting the above described functions "$\Theta_U$", "$\Theta_K$", $\Theta_Z$, "A", and "B". Various adjustment functions are stored as built-in functions in the processing device beforehand. If the identification number of a desired function is input as a selection condition, the specified built-in function is automatically set. Or, if the definition of a new function is input as a selection condition, the new adjustment function is set.

A boundary condition 37 represents a boundary condition for a domain "D" of a cost function. For example, if a torus is specified as a boundary condition, the processing device recognizes the area "D" to be successive in a torus state, and performs the numerical integration.

FIG. 4 shows the output data 22. In this output data 22, a time change of a state variable 41 represents a change of a variable "q", and a time change of other variable values 41 represent a change of variables other than "q". A time change of an optimum cost value 43 represents a change of an optimum value of a cost value obtained by a search.

Additionally, a frequency of a cost function value 44 represents a realization frequency of the cost value, which is totaled for each discretization interval. A frequency of a system temperature 45 represents a realization frequency of the temperature, which is totaled for each discretization interval. A frequency of a coordinate to be observed 46 represents a realization frequency of a coordinate value "$q_{obs}$", which is totaled for each discretization interval.

Next, the processes performed by the processing device shown in FIG. 2 are explained in detail by referring to FIGS. 5 through 12.

Figure 5:
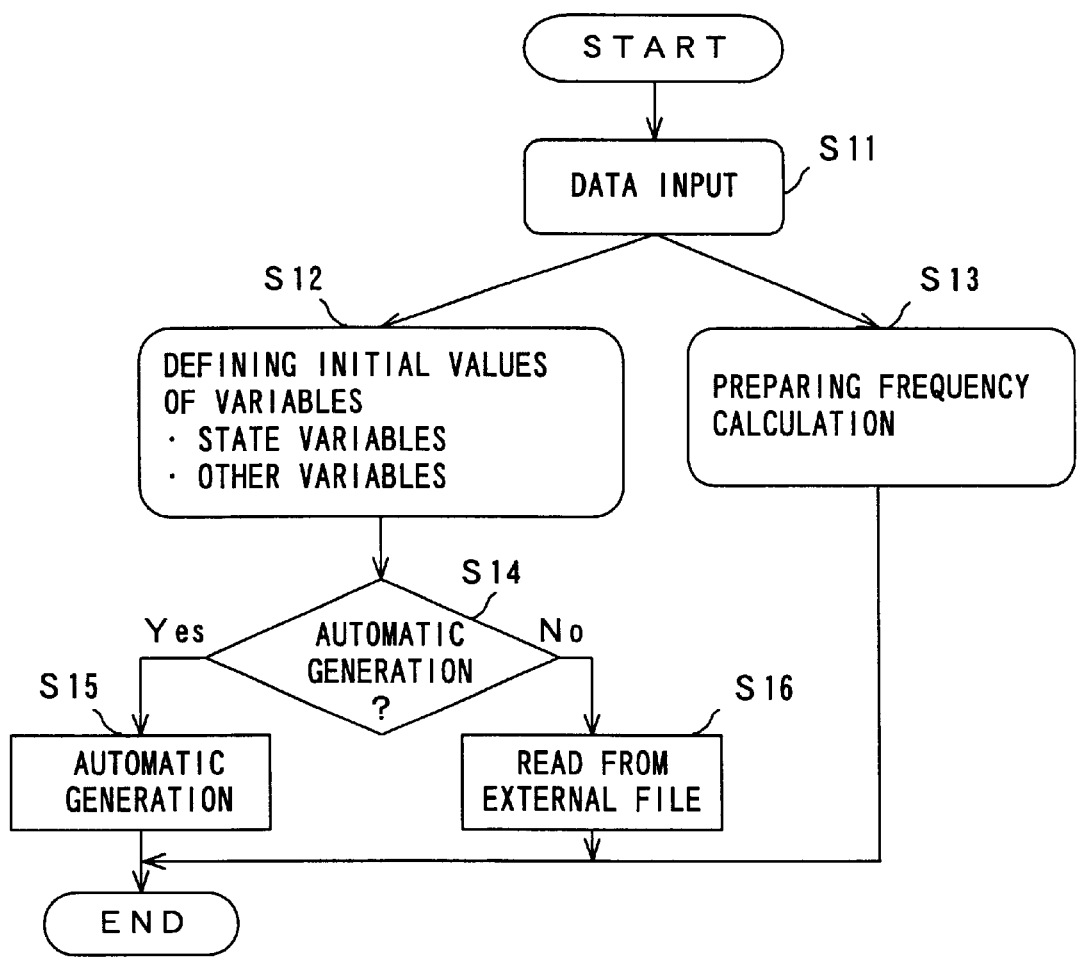
FIG. 5 is a flowchart showing the process performed by an inputting unit.

FIG. 5 is a flowchart showing the process performed by the inputting unit 10. The inputting unit 10 first inputs input data 21 (step S11), performs the process for defining the initial values of state variables and other variables (step S12), and prepares for a frequency calculation (step S13).

In the initial value definition process, the inputting unit 10 inquires of a user as to whether or not to perform automatic generation (step S14). If the automatic generation is instructed, the inputting unit 10 generates the initial values of respective variables with a predetermined method (step S15), and terminates the process. If the automatic generation is not instructed, the inputting unit 10 reads the initial values from a predetermined external file, assigns the read values to the respective variables (step S16), and terminates the process.

FIG. 6 is a flowchart showing the process performed by the cost defining unit 11. The cost defining unit 11 first defines a cost function and its partial derivative based on the parameters 31 (step S21), and inquires of a user as to whether or not to modify the cost function (step S22). If modification is instructed, the cost defining unit 11 modifies the cost function (step S23), and terminates the process. If the modification is not instructed, the cost defining unit 11 terminates the process without modifying the cost function. As an example of cost function modification, the operation for excluding the part of a relatively large value of a defined cost function from a search target is considered.

FIG. 7 is a flowchart showing the process performed by the cost function value calculating unit 12. The cost function value calculating unit 12 receives a cost function from the cost defining unit 11, and calculates the value of the cost function based on an updated state "q" at a time "t" (step S31). Then, the cost function value calculating unit 12 calculates the value of the partial derivative of the cost function (step S32), and terminates the process.

FIG. 8 is a flowchart showing the process performed by the function generating unit 13. The function generating unit 13 first determines whether or not to newly generate an adjustment function based on the selection conditions of adjustment functions 36 (step S41). If the selection conditions 36 instructs new generation, the function generating unit 13 generates an adjustment function based on input information (step S42), and terminates the process. If the new generation is not instructed, the function generating unit 13 terminates the process without generating an adjustment function.

Figure 9:
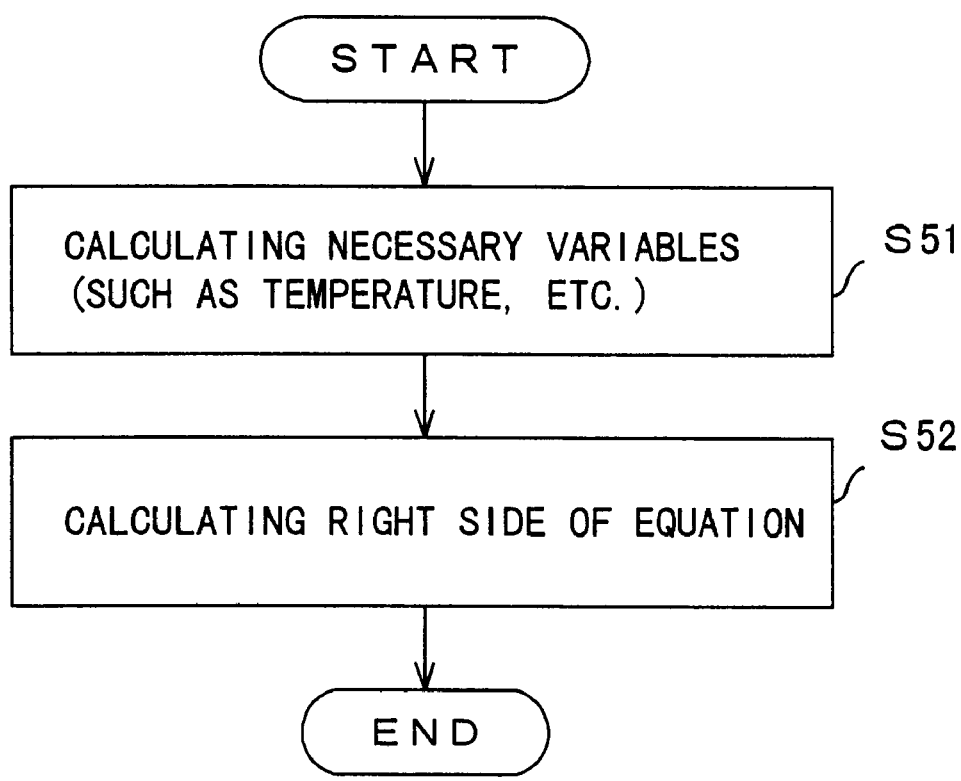
FIG. 9 is a flowchart showing the process performed by an equation calculating unit.

FIG. 9 is a flowchart showing the process performed by the equation calculating unit 14. The equation calculating unit 14 calculates the variables such as a temperature, etc., which are required for calculating the equations (1) through (4) (step S51), calculates the right sides of the equations (1) through (4) by using the calculation results (step S52), and terminates the process.

Figure 10:
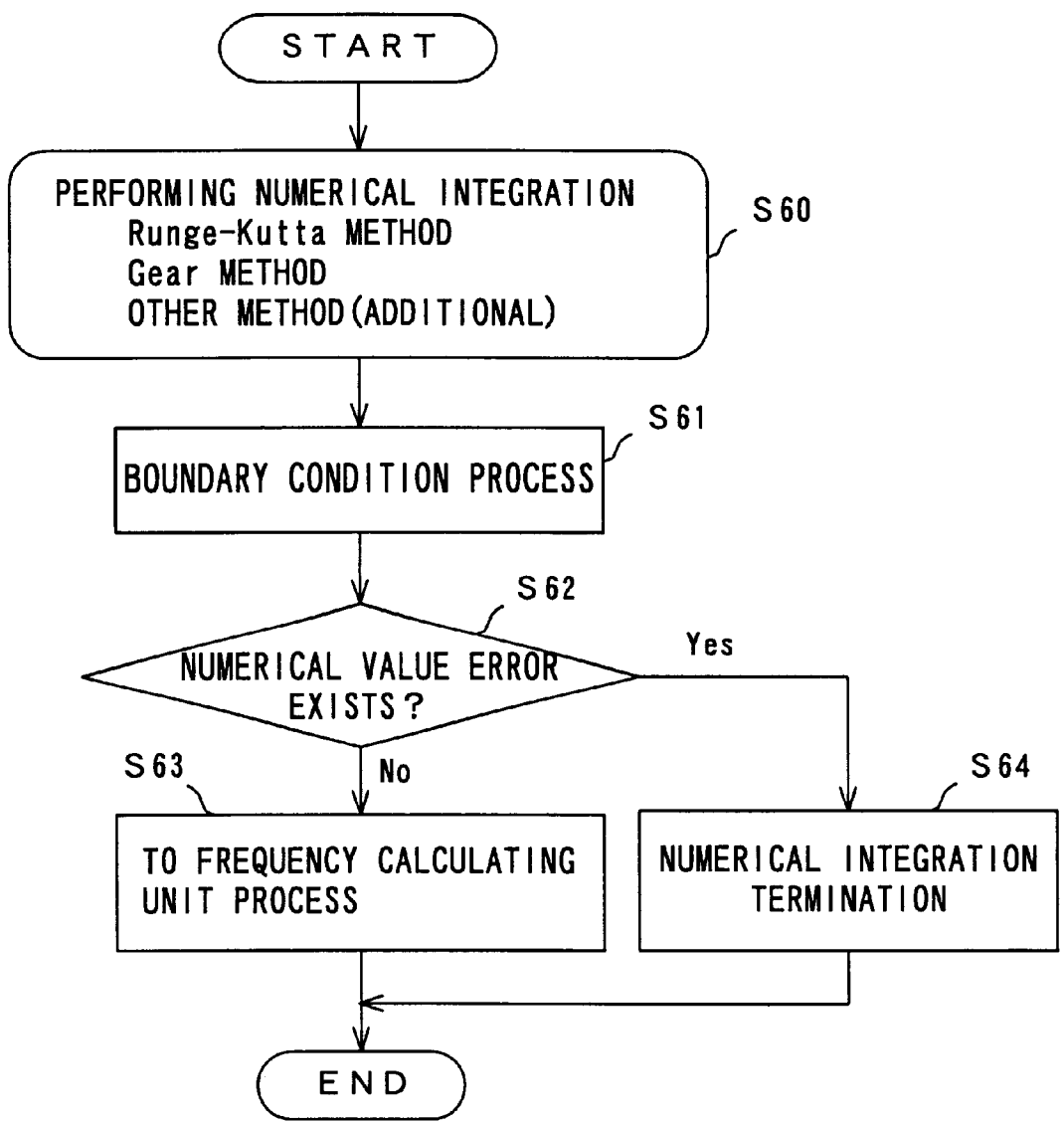
FIG. 10 is a flowchart showing the processes performed by a numerical integration performing unit and a checking unit.

FIG. 10 is a flowchart showing the processes performed by the numerical integration performing unit 15 and the checking unit 16. The numerical integration performing unit 15 performs numerical integration with a Runge-Kutta method, a Gear method, or a different method (step S60), and performs the process regarding the boundary condition 37 (step S61). Then, the checking unit 16 checks whether or not a numerical error occurs (step S62).

If no numerical error occurs, the checking unit 16 requests the frequency calculating unit 17 to perform the succeeding process (step S63), and terminates the process. If a numerical value error occurs, the checking unit 16 terminates the numerical integration regardless of whether or not a termination condition is satisfied (step S64), and terminates the process.

Figure 11:
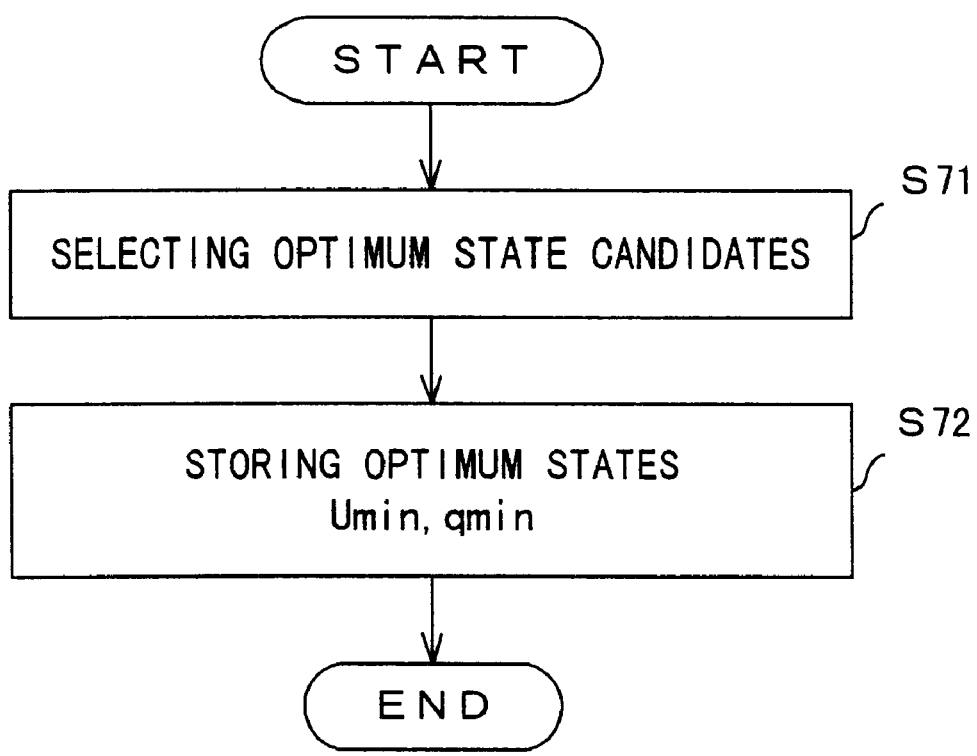
FIG. 11 is a flowchart showing the process performed by a candidate selecting unit.

FIG. 11 is a flowchart showing the process performed by the candidate selecting unit 18. The candidate selecting unit 18 selects a plurality of optimum state candidates from among the states obtained so far based on the results of the calculations made by the frequency calculating unit 17 and by the cost function value calculating unit 12 (step S71). Then, the candidate selecting unit 18 stores the selected states as candidates of "$q_{min}$" and the corresponding cost values as candidates of "$U_{min}$" (step S72), and terminates the process.

Figure 12:
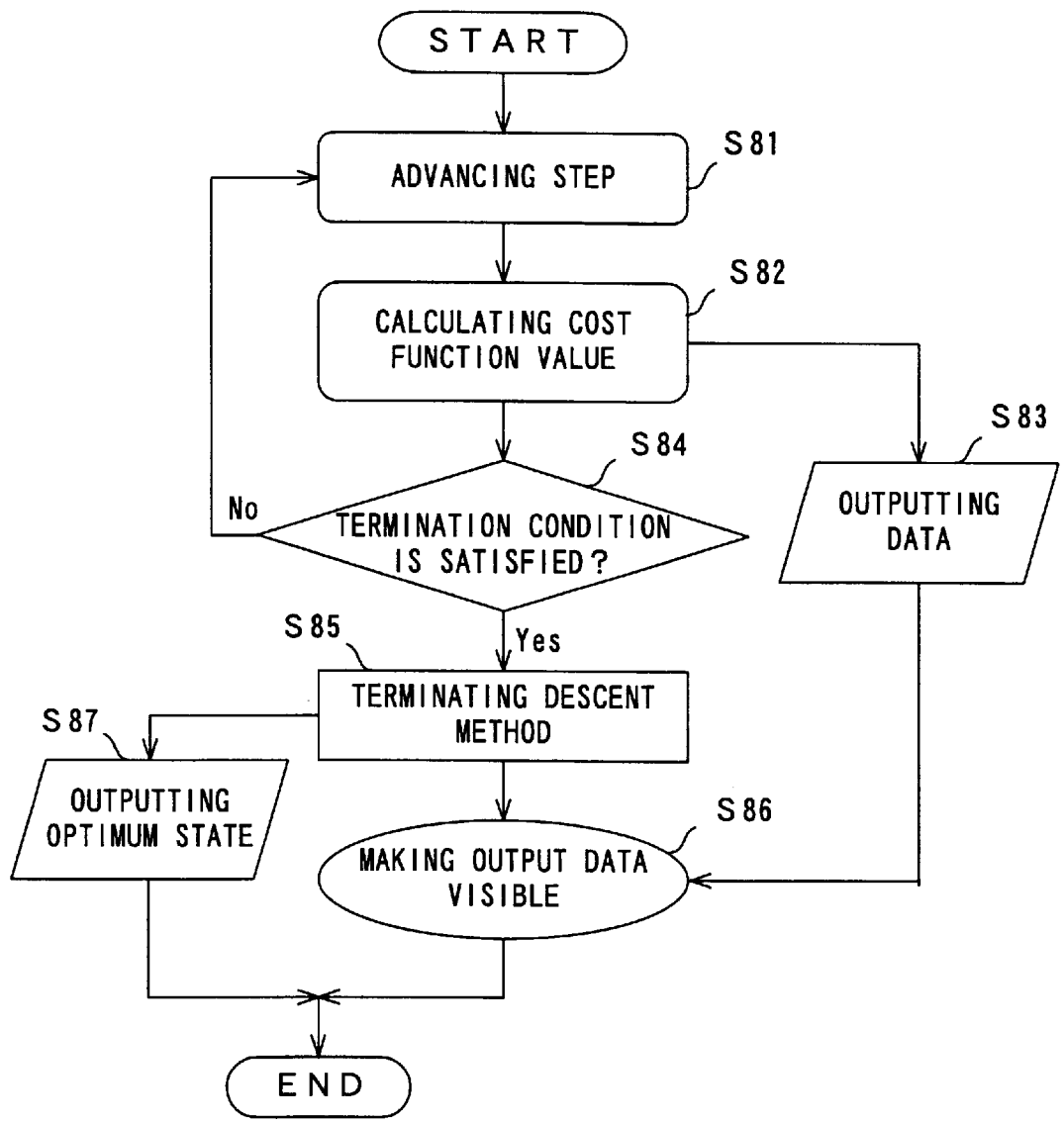
FIG. 12 is a flowchart showing the process performed by a descending unit.

FIG. 12 is a flowchart showing the process performed by the descending unit 20. The descending unit 20 first advances the calculation step of a predetermined descent method by recognizing a given candidate of "$q_{min}$" as an initial state (step S81), and calculates the value of a cost function (step S82). Then, the descending unit 20 outputs the calculation result to a file (step S83), and checks whether or not a termination condition is satisfied (step S84).

If the termination condition is not satisfied, the descending unit 20 repeats the operations in and after step S81. If the termination condition is satisfied, the descending unit 20 terminates the descent method (step S85). Then, the descending unit 20 makes the output data visible on a display screen (step S86), outputs the obtained optimum state (step S87), and terminates the process.

Described next is the result of simulation of the numerical integration with a 4th Runge-Kutta method by setting n=2 and representing a cost function U(q) with a sum of seven two-dimensional Gaussian functions. A search area "D" is assumed to be a two-dimensional torus, and adjustment functions are set as follows.

$A=0$ $B=0$ $\Theta_U(u)=(1/2T')u^2$ $\Theta_K(k)=(1/2T)k$ $\Theta_Z(\zeta, w)=(1/2T)(Q\zeta^2+\alpha'w^2)$ (22)

Here, "T'", "T", and "α" are parameters which determine the adjustment functions, and are set as follows.

$T'=10.0$ $T=10.0$ $\alpha'=0.0$

Additionally, the adjustment parameters are set as follows.

$\beta=nT=20.0$ $Q=0.001$ $\alpha=0.0$

Furthermore, the initial conditions are set to be $q_1=q_2=p_2=\zeta=w=0.0$, and $p_1=T^{0.5}$, the number of steps of the numerical integration is set to be 10000000, and the time interval of the numerical integration is set to be 0.0001. Since the amount of data may sometimes become significant if data are output in all of the steps, the data output interval is set to be 1000 steps.

Figure 13:
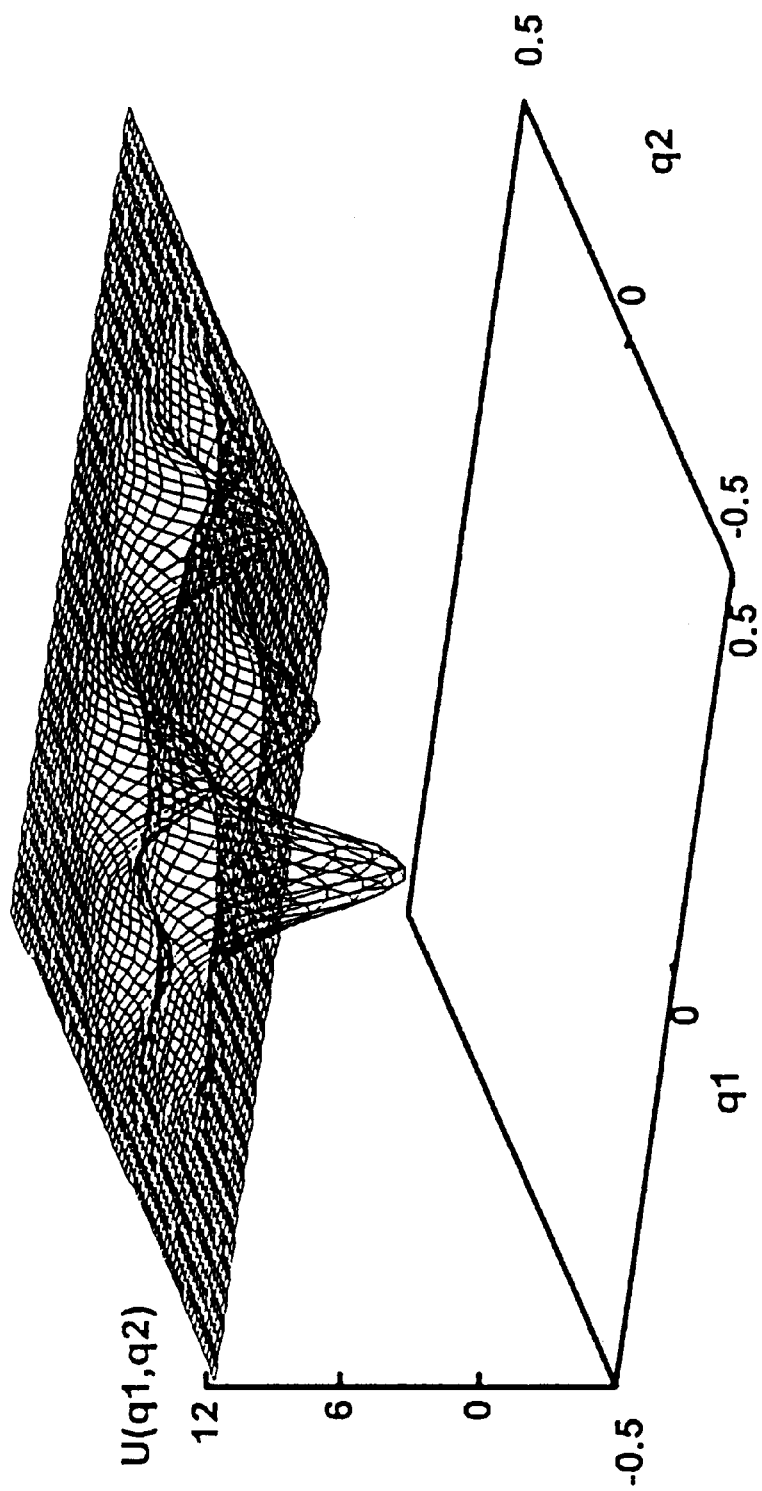
FIG. 13 shows a cost function.
Figure 14:
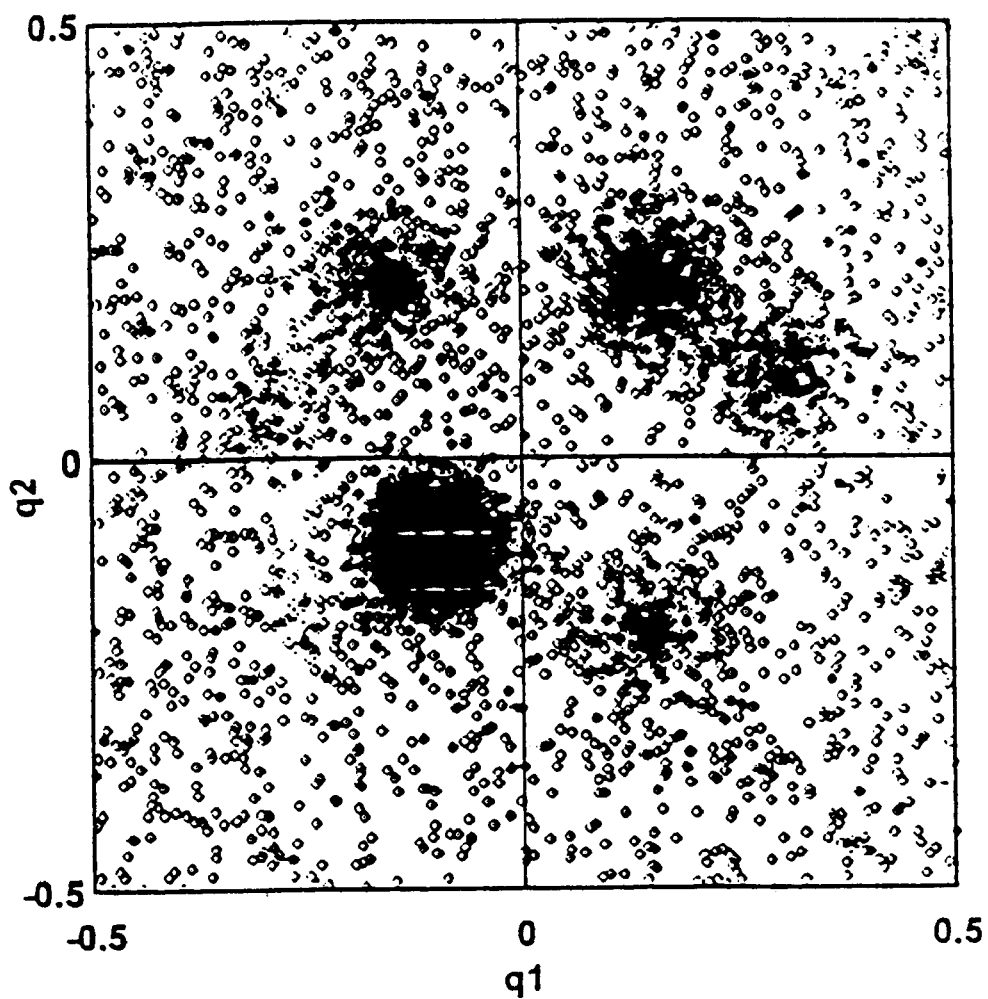
FIG. 14 shows a coordinate value distribution.
Figure 15:
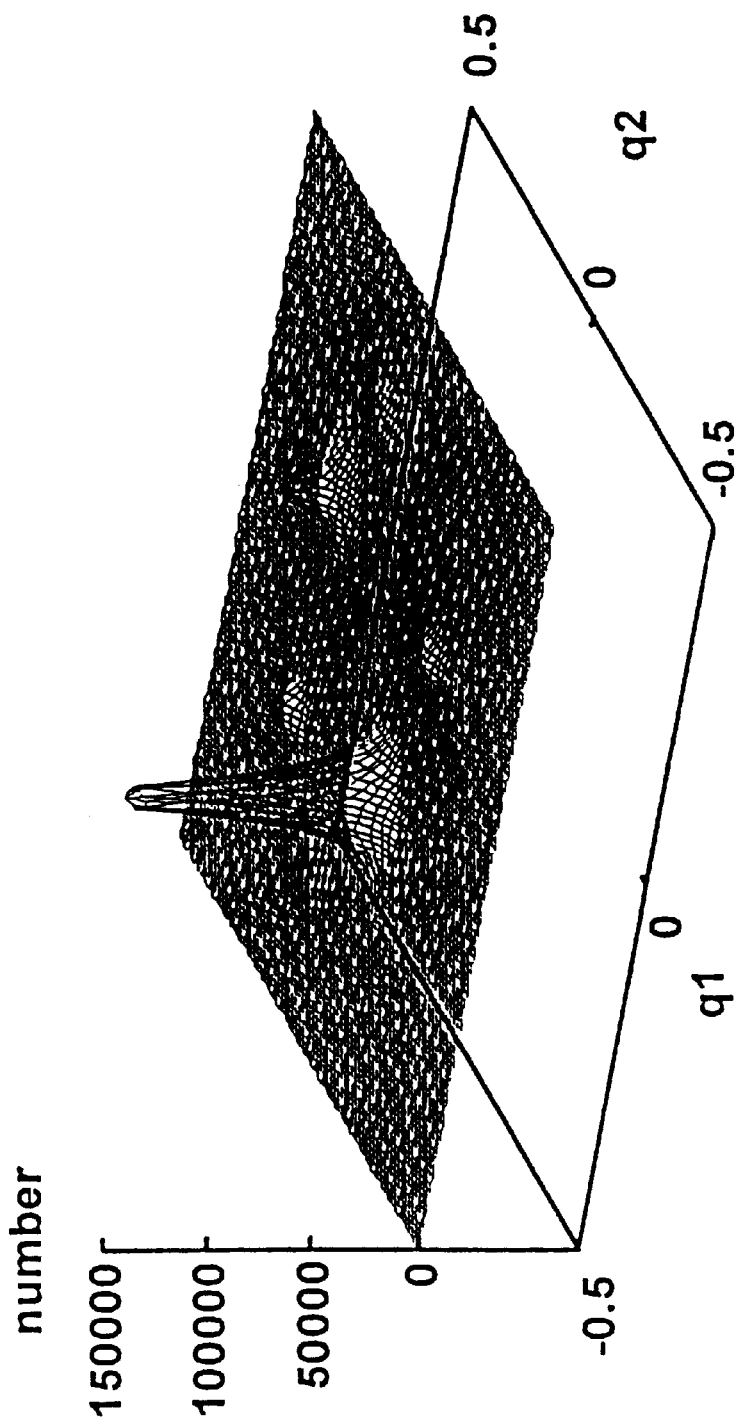
FIG. 15 shows the realization frequency of a coordinate value.
Figure 16:
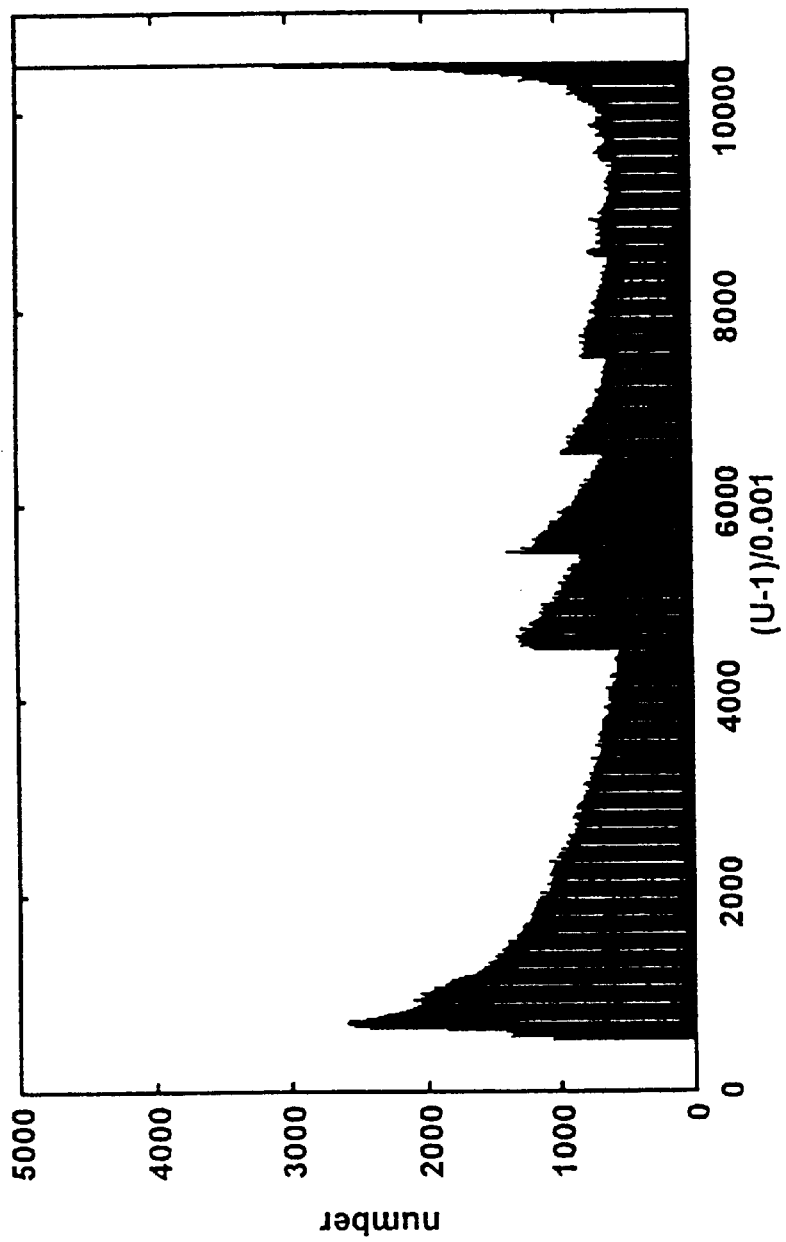
FIG. 16 shows the realization frequency of a cost function value.

At this time, U(q) is given as a function shown in FIG. 13, and includes a plurality of local minimum values. The smallest value among these values becomes an optimum value of a cost function. After the numerical integration is performed by a specified number of steps, the coordinate value distribution shown in FIG. 14 is obtained and the realization frequency of a coordinate value becomes the one shown in FIG. 15. In this figure, the frequency becomes high at the positions corresponding to the minima values shown in FIG. 13. Additionally, the realization frequency of the cost function becomes the one shown in FIG. 16. The frequency peaks shown in FIG. 16 correspond to the local minimum values shown in FIG. 13.

In the above described preferred embodiments, the cost function is defined to be a function of "n" real variables, which is differentiable. Also in a problem described by discrete variables, a similar search can be performed if a suitable cost function is set. As discrete optimization problems, for example, an optimum location problem, an optimum route problem, an optimum network problem, an optimum flow problem, an optimum efficiency problem, etc.

The optimum location problem is a problem of optimizing the location of a facility, etc. in an urban design. The optimum route problem is a problem of optimizing a route in car navigation, an electric circuit, etc.

Additionally, the optimum network problem is a problem of optimizing gas or water pipe laying, electrical wiring, communications network, etc. The optimum flow problem is a problem of optimizing a traffic flow on a road, a data flow on a network, etc. The optimum efficiency problem is a problem of optimizing an efficiency in fields such as science, engineering, economy, business, etc.

The above described processing device can be configured by using an information processing device (computer) shown in FIG. 17. The information processing device shown in this figure comprises a CPU (Central Processing Unit) 51, a memory 52, an input device 53, an output device 54, an external storage device 55, a medium driving device 56, and a network connecting device 57, which are interconnected by a bus 58.

The memory 52 includes, for example, a ROM (Read Only Memory), a RAM (Random Access Memory), etc., and stores programs and data used for processing. The CPU 51 performs necessary processing by executing the programs with the memory 52.

The inputting unit 10, the cost defining unit 11, the cost function value calculating unit 12, the function generating unit 13, the equation calculating unit 14, the numeric integration performing unit 15, the checking unit 16, the frequency calculating unit 17, the candidate selecting unit 18, the outputting unit 19, and the descending unit 20, which are shown in FIG. 2, correspond to software components stored in specific program code segments in the memory 52, and are implemented by a program composed of one or more instructions.

The input device 53 is, for example, a keyboard, a pointing device, a touch panel, etc., and is used to input the instruction or the information from a user. The output device 54 is, for example, a display, a printer, a speaker, etc., and is used to output an inquiry to a user or a process result.

The external storage device 55 is, for example, a magnetic disk device, an optical disk device, a magneto-optical disk device, etc. The information processing device may store the above described programs and data in the external storage device 55, and can use them by loading into the memory 52 depending on need. Additionally, the external storage device 55 may be used also as a database storing cost functions, adjustment functions, etc.

The medium driving device 56 drives a portable storage medium 59, and accesses its stored contents. As the portable storage medium 59, an arbitrary computer-readable storage medium such as a memory card, a floppy disk, a CD-ROM (Compact Disk-Read Only Memory), an optical disk, a magneto-optical disk, etc. is used. The above described programs and data may be stored in the portable storage medium 59, and can be used by being loading into the memory 52 as occasion demands.

The network connecting device 57 communicates with an external device via an arbitrary network (line) such as a LAN (Local Area Network), and performs data conversion accompanying a communication. The information processing device may receive the above described programs and data from an external device via the network connecting device 57, and can use them by loading into the memory 52 depending on need.

FIG. 18 shows computer-readable storage media which can provide programs and data to the information processing device shown in FIG. 17. The programs and data stored in the portable storage medium 59 or an external database 60 are loaded into the memory 52. The CPU 51 performs necessary processing by executing the programs with the data.

Next, the result of the simulation where the search processing according to the present invention is applied to the problem of optimizing the arrangement of a multi-particle system such as molecules, atoms, etc. In this case, the particle arrangement corresponding to the minimum energy state of a particle system is searched.

Assuming that the space where N particles are arranged is an m-dimensional space, the number of degrees of freedom n becomes Nm. At this time, the positional vectors $r_1, \ldots, r_N$ are given by the following equations.

$$r_1 = (q_1, \ldots, q_m),$$
$$r_2 = (q_{m+1}, \ldots, q_{2m}),$$
$$r_N = (q_{(N-1)m+1}, \ldots, q_{Nm}) \quad (23)$$

Additionally, assuming that the search space of each positional vector is the whole of the m-dimensional space, the Nm-dimensional arrangement space is represented as follows.

$$R^{Nm} - \bigcup_{i<j} \{(r_1, \ldots, r_N) \mid r_i = r_j\} \quad (24)$$

Figure 19:
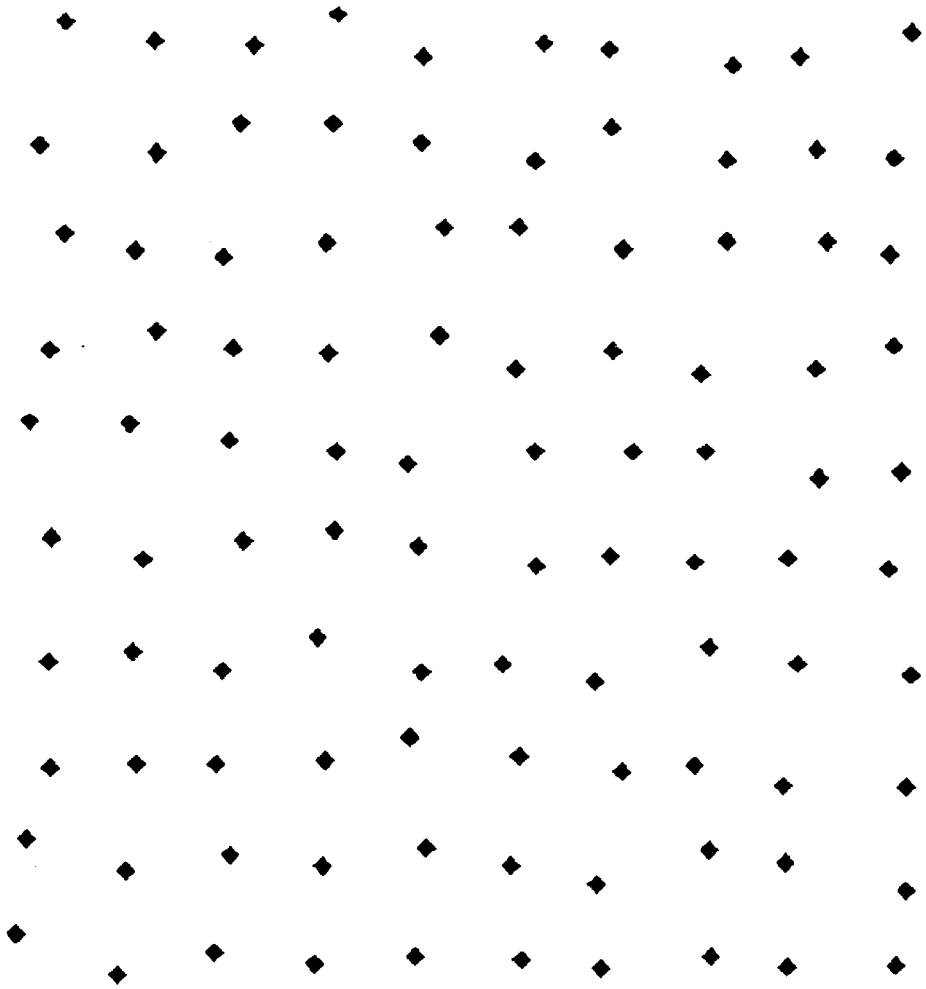
FIG. 19 exemplifies a particle arrangement.

For example, if N=100 and m=2, the particle arrangement shown in FIG. 19 can possibly exist. In FIG. 19, 100 particles are arranged on the two-dimensional plane. Furthermore, as the cost function U(q), the potential energy function of the particle system represented by the following equation is used.

$$U(q) = \sum_{1 \leq i, j \leq N} \phi(\|r_i - r_j\|) \quad (25)$$

where $\|r_i - r_j\|$ represents the distance between "i"th and "j"th particles, and a function $\phi(\|r_i - r_j\|)$ represents a pair potential. If the pair potential is set on a Lennard-Jones type, a function $\phi(r)$ is given by the following equation.

$$\phi(r) = 4\epsilon((\sigma/r)^{12} - (\sigma/r)^6) \quad (26)$$

Figure 20:
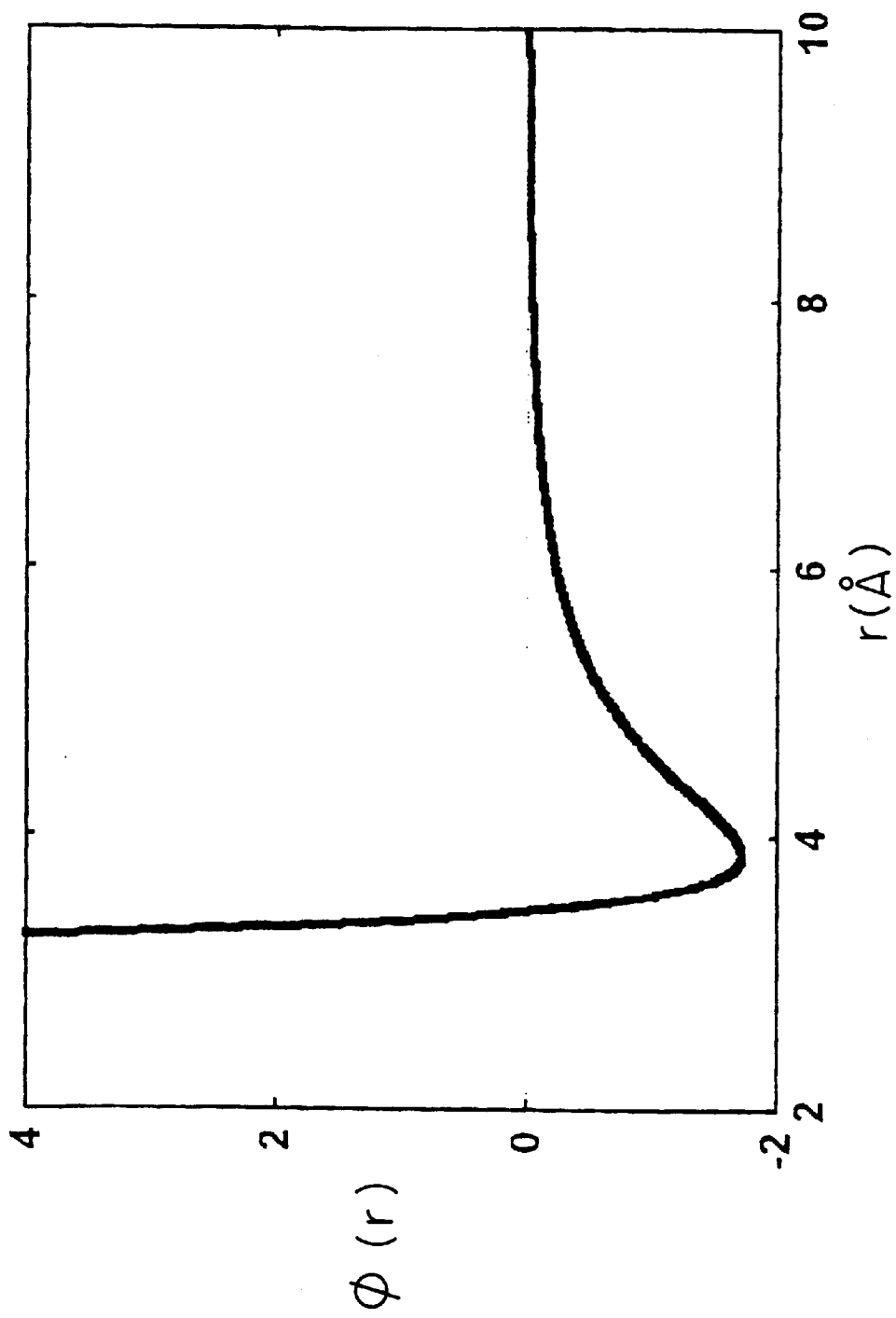
FIG. 20 shows a potential function.

If "Å" is used as the unit of the distance between particles and $\epsilon$=1.7258 and $\sigma$=3.446 are set, the function form of $\phi(r)$ becomes the one shown in FIG. 20. Additionally, the adjustment functions and the adjustment parameters are set as follows.

$$A = 0$$

$$B = 0$$
$$\Theta_U(u) = \{(U_* - U_M)/aT\} \{(u - U_M)/(U_* - U_M)\}^a$$
$$\Theta_K(k) = (1/2\beta)k$$
$$\Theta_Z(\zeta, w) = (1/2\beta)(Q\zeta^2 + \alpha'w^2)$$
$$T' = 20.0$$
$$\alpha' = \alpha = 0$$
$$\beta = nT = 4000$$
$$Q = 0.001 \quad (27)$$

Note that, however, the following three types of combinations are used as $U_*$, $U_M$, and a.

$$C1: \quad U_* = 8079.0 + U_{1b}$$
$$U_M = 7000.0 + U_{1b}$$
$$a = 4.0$$

$$C2: \quad U_* = 8079.0 + U_{1b}$$
$$U_M = 7000.0 + U_{1b}$$
$$a = 2.0$$

$$C3: \quad U_* = 1.0 + U_{1b}$$
$$U_M = U_{1b}$$
$$a = 2.0$$

$$U_{1b} = -\epsilon N(N-1)/2 = -8542.7 \quad (28)$$

Figure 21:
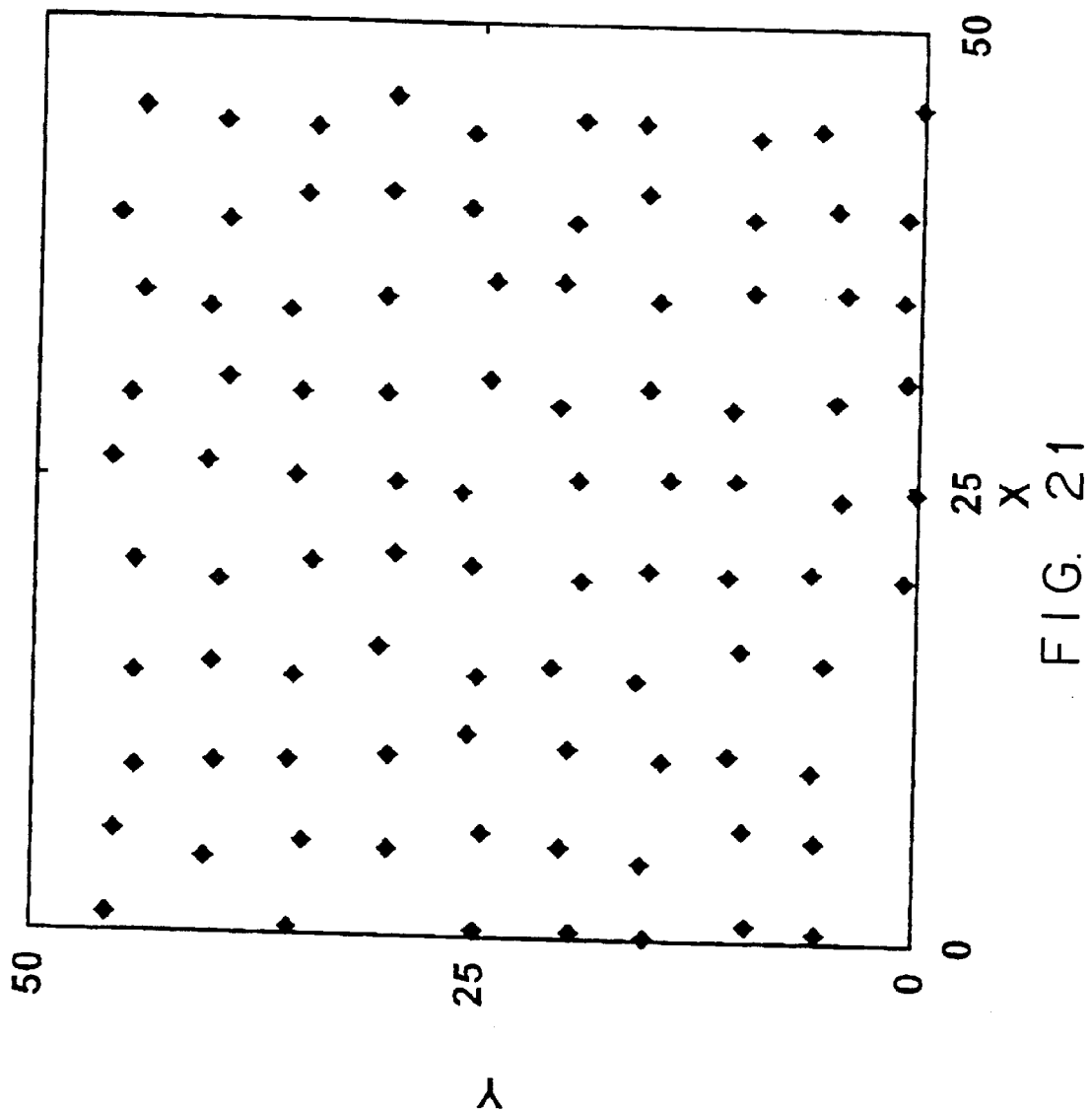
FIG. 21 shows an initial arrangement.

Furthermore, the numerical integration is performed with the 4th Runge-Kutta method under the condition that the particle arrangement shown in FIG. 21 is used as the initial arrangement, the number of steps of the numerical integration is 50,000 to 200,000, and the time interval of the numerical integration is 0.0001.

Figure 22:
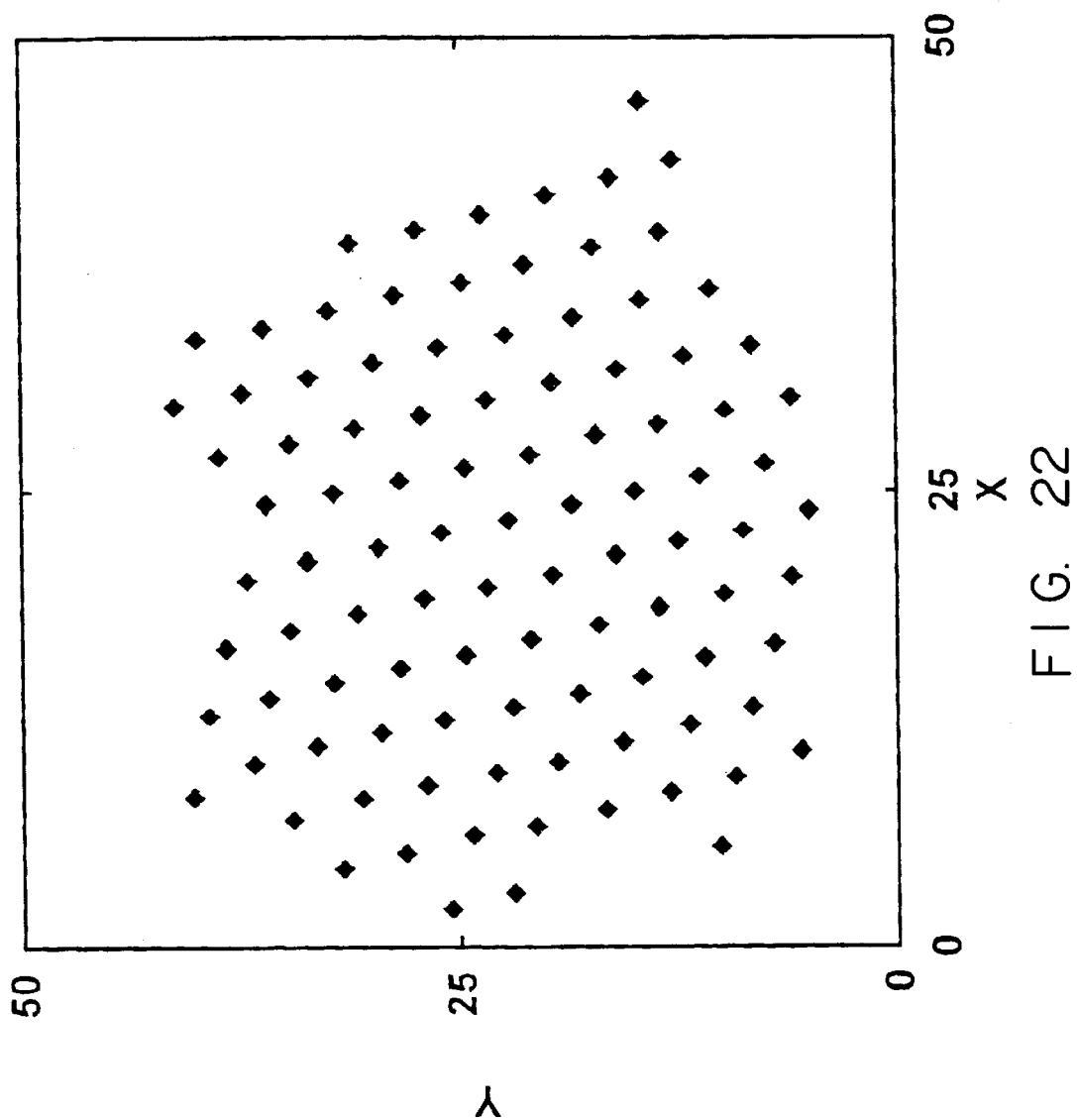
FIG. 22 shows a first simulation result.
Figure 23:
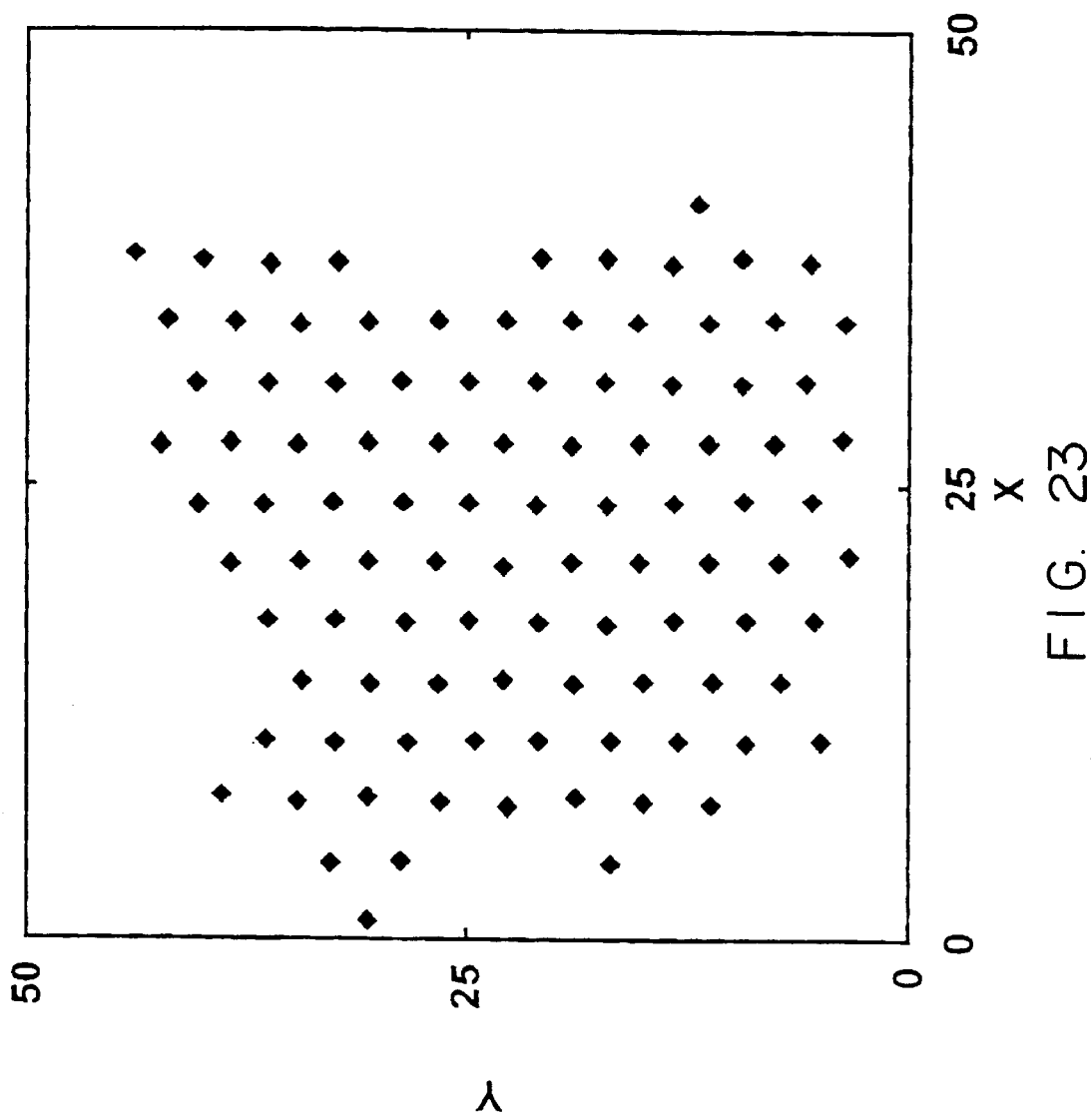
FIG. 23 shows a second simulation result.
Figure 24:
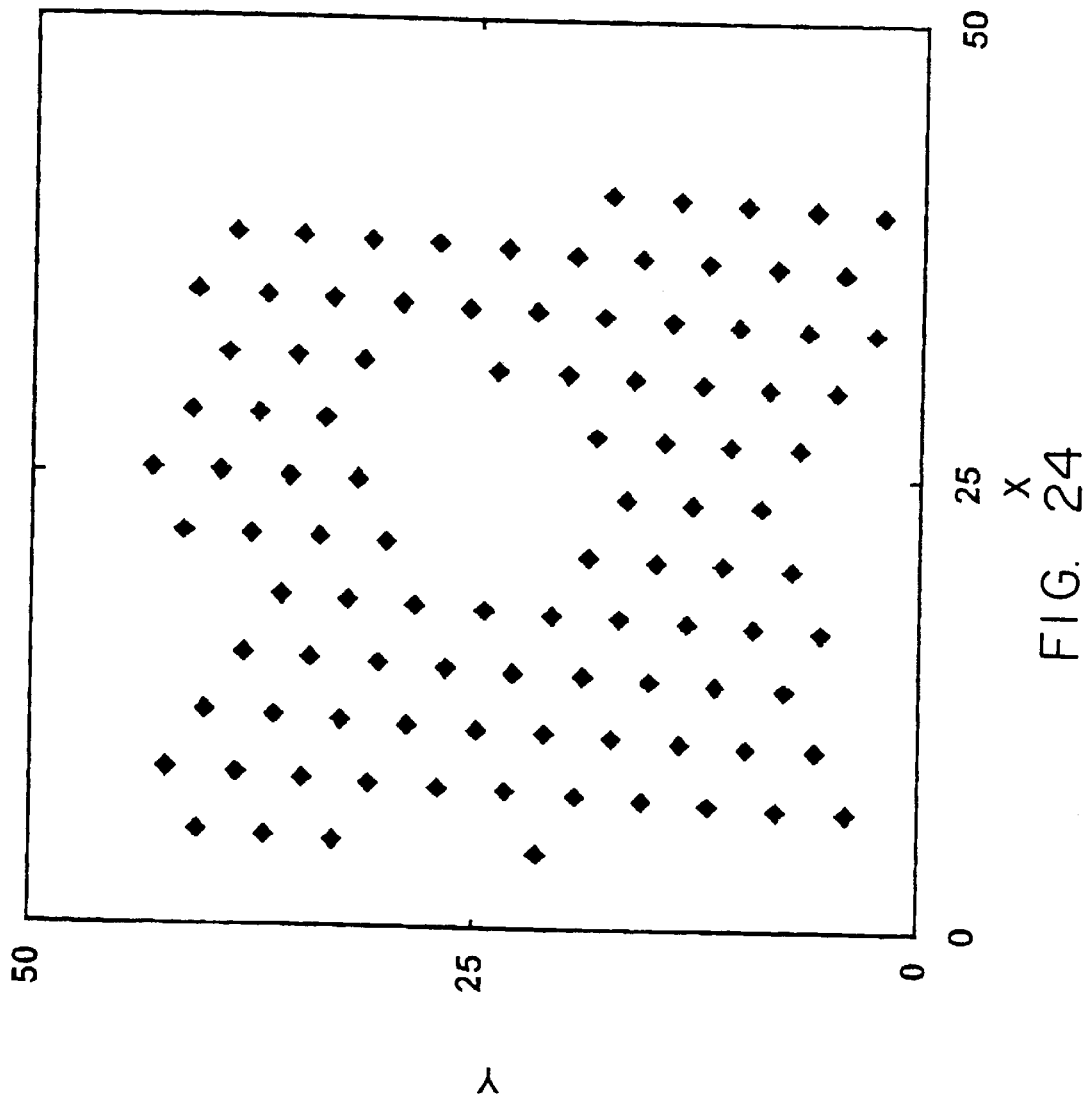
FIG. 24 shows a third simulation result.

As a result, the particle arrangements shown in FIG. 22, 23 and 24 are obtained as the candidates of the minimum energy states in the above described cases of C1, C2, and C3. The values of the cost function in the arrangements shown in FIGS. 22, 23, and 24 are respectively −478.52, −479.67, and −463.45.

Figure 25:
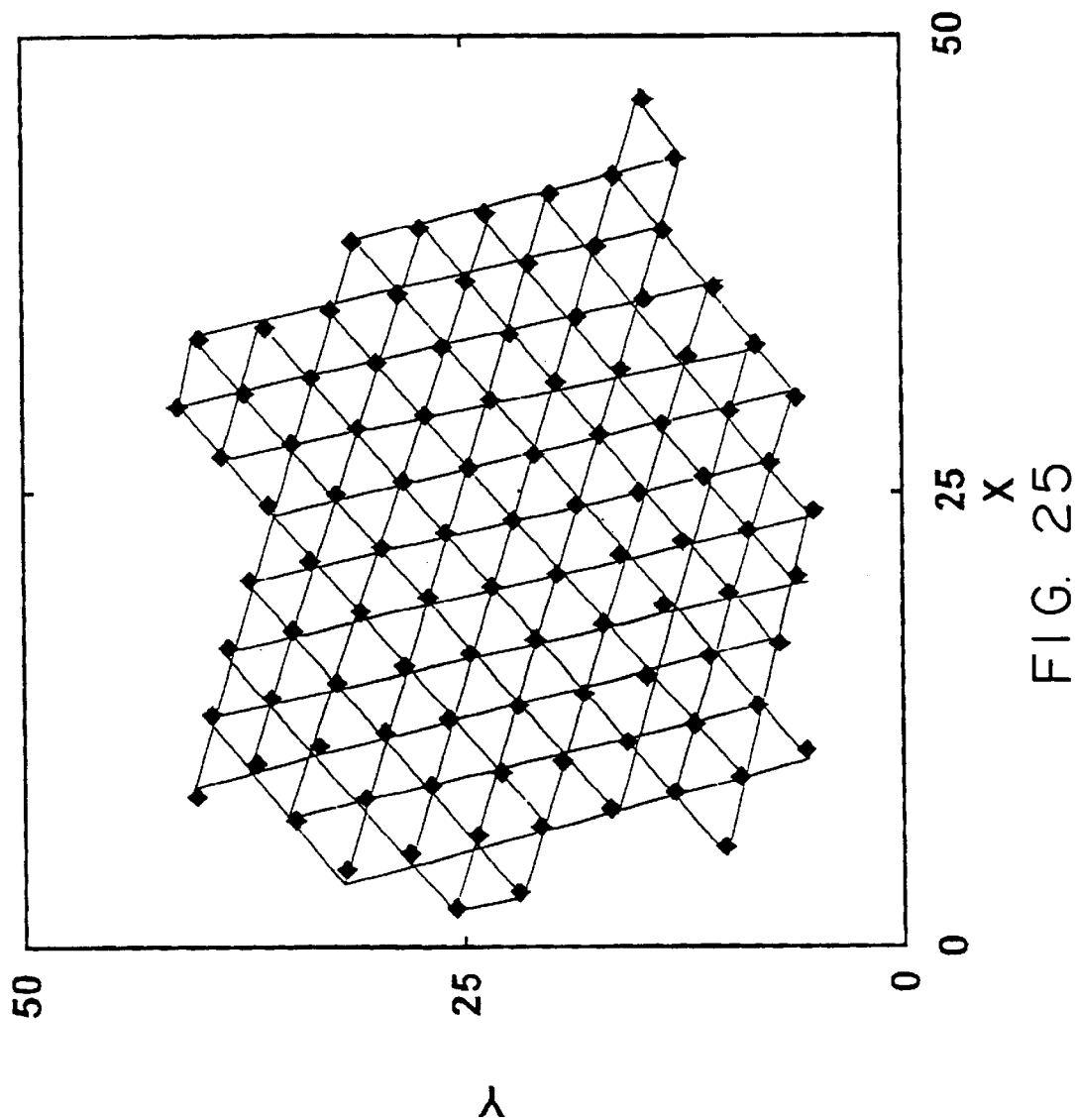
FIG. 25 shows the evaluation of the first simulation result.
Figure 26:
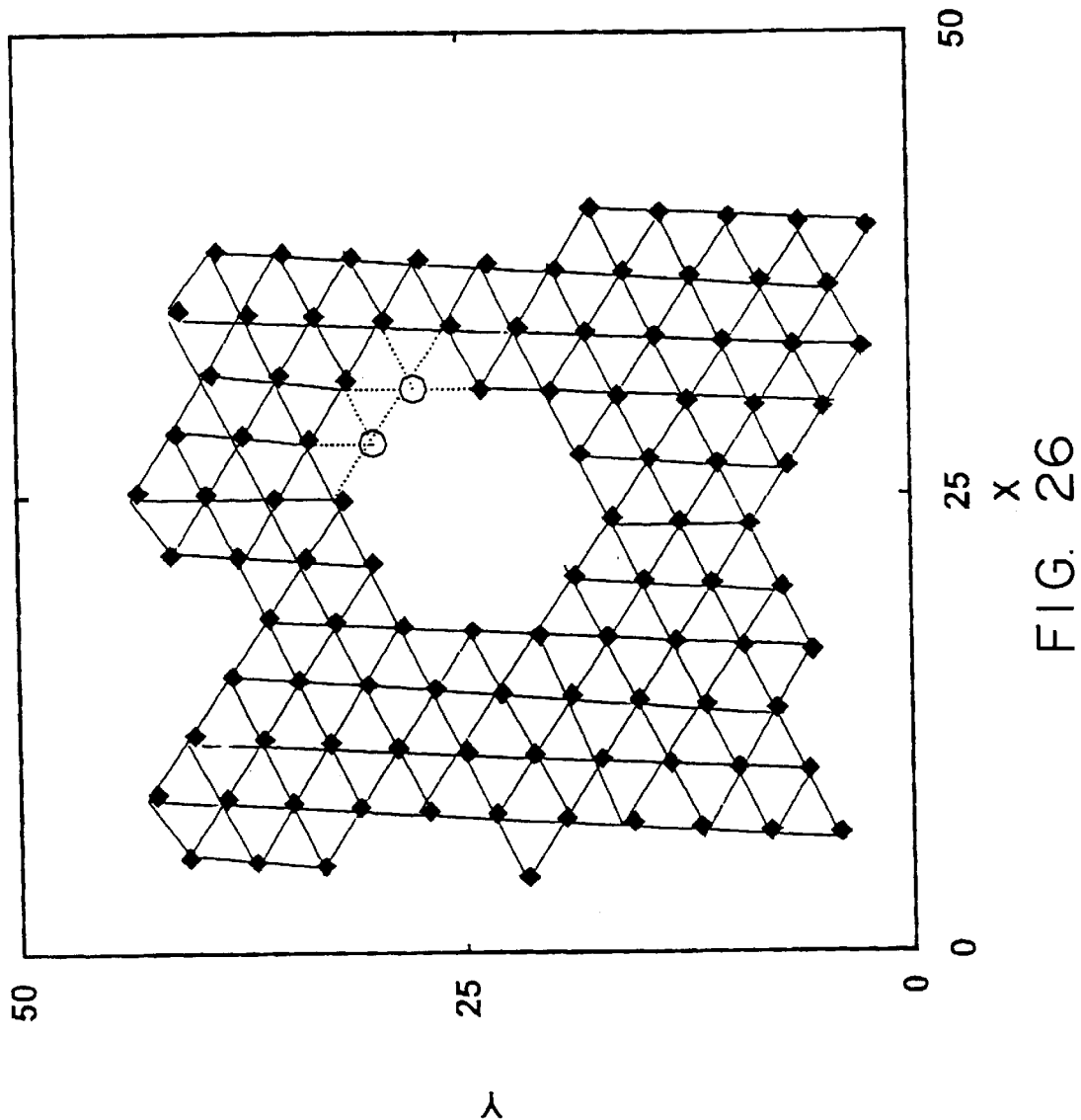
FIG. 26 shows the evaluation of the third simulation result.

In FIGS. 22 and 24, if adjacent particles are linked by straight lines and evaluated, the results become the ones shown in FIGS. 25 and 26. Something like a lattice defect occurs as indicated by a symbol "○" in the arrangement shown in FIG. 26. In the meantime, such a defect is not found in the arrangement in FIG. 25.

FIGS. 27 through 53 exemplify the program codes of the search processing using the cost function shown in FIG. 13. FIGS. 27 through 36 among these figures correspond to the main routine. The program code shown in FIG. 27 defines the variables used for the processing. The program code shown in FIG. 28 defines input data shown in FIG. 3. The program code shown in FIG. 29 defines constants.

Here, NFREE, NSTEP, DT, NOUT, NUMFUNC, and IPBC respectively correspond to the degree of freedom "n", the number of steps, the time interval, the output specification parameter, the number of a built-in function, and the boundary condition. Here, n is equal to 2.

Additionally, TEMP, QMASS, ALPHA1, ALPHA2, TEMP2, and BETA respectively correspond to the above described parameters T, Q, α, α', T', and β. Also UEX is given as one of the adjustment parameters. Here, the functions represented by the equations (22) are used as the adjustment functions.

Furthermore, Q(1), Q(2), P(1), P(2), Z(1), and Z(2) respectively correspond to the above described variables $q_1$, $q_2$, $p_1$, $p_2$, $\zeta$, and w. UMIN, DOSUU(*,1), DOSUU(*,2), and DOSUU2(*,*,1) respectively correspond to the optimum cost value, the frequency of the cost function value, the frequency of the system temperature, and the frequency of the coordinate to be observed shown in FIG. 4.

The program code shown in FIG. 30 corresponds to the process in step S12 shown in FIG. 5, and defines the initial values of variables. The program code shown in FIG. 31 corresponds to the process in step S13 shown in FIG. 5, and prepares the histogram for a frequency calculation. The program code shown in FIG. 32 records input data. Here, DR1 and DR2 corresponds to the discretization interval shown in FIG. 3. UINI, UFIN, P21NI, and P2FIN corresponds to the variable scope parameters shown in FIG. 3. The program code shown in FIG. 33 corresponds to the loop process of the numerical integration shown in FIG. 2, and calls a subroutine AMDYN.

The program code shown in FIG. 34 makes output data visible, and outputs frequency data. The program code shown in FIG. 35 further outputs a cost function graph and its partial differentiation graph. The program code shown in FIG. 36 calls a subroutine DESCENT of a descent method, and terminates the process.

FIGS. 37 through 43 show the subroutine AMDYN of the numerical integration, which is called in FIG. 33. The program code shown in FIG. 37 defines the variables used for the process. The program code shown in FIG. 38 corresponds to the process in step S60 shown in FIG. 10, and performs the numerical integration by using a subroutine EQ1 with the 4th Runge-Kutta method. The program code shown in FIG. 39 corresponds to the process in step S61 shown in FIG. 10, and processes a boundary condition. Here, a torus is used as the boundary condition. However, a different boundary condition may be specified. The program code shown in FIG. 40 calculates the values of variables.

The program code shown in FIG. 41 corresponds to the process in step S63 shown in FIG. 10, and calculates frequencies. The program code shown in FIG. 42 corresponds to the processes in steps S71 and S72, and selects an optimum state candidate. Here, the state where the cost function becomes a minimum is selected as an optimum state. Alternatively, also a semi-optimum state, etc. may be selected. The program code shown in FIG. 43 outputs a calculation result as output data.

FIGS. 44 through 47 show the subroutine EQ1 of an equation calculation, which is called in FIG. 38. The program code shown in FIG. 44 defines the variables used for the process. The program code shown in FIG. 45 calls a subroutine COSTFUNC for calculating the value of a cost function. The program code shown in FIG. 46 corresponds to the process in step S51 shown in FIG. 9, and calculates a system temperature. The program code shown in FIG. 47 corresponds to the process in step S52 shown in FIG. 9, and calculates the right side of the equation.

FIGS. 48 through 52 show the subroutine COSTFUNC for calculating the value of a cost function, which is called in FIGS. 37, 40, and 45. This subroutine corresponds to the process of FIG. 7. First of all, the program code shown in FIG. 48 defines the variables used for the process. The program code shown in FIG. 49 specifies a built-in function.

In this way, the value of the cost function corresponding to the program code shown in FIG. 50 or 51 is calculated. Here, since NUMFUNC=1, the cost function shown in FIG. 50 is used. The program code shown in FIG. 52 records input data.

FIG. 53 shows a subroutine DESCENT of the descent process, which is called in FIG. 36. This program code corresponds to the process in FIG. 12, and obtains an optimum state with the descent method.

According to the present invention, optimum state candidates can be sequentially searched by using the capability for local searching and the capability for avoiding a trap into a local minimum state in the processing for searching the state corresponding to the optimum value of a cost function. These two capabilities may be implemented by suitably setting adjustment functions, not in accordance with the nature of a force function or a temperature control.

Additionally, the realization probability of the state of a low cost value can be improved not directly dependent on the value of the temperature parameter for controlling a search speed. Therefore, the temperature parameter can be increased to a value such that no fault is caused by a numerical value calculation error, whereby the processing speed promises to be improved.

What is claimed is:

1. A processing device, comprising:
an inputting device inputting information of a state which describes a problem and a cost function which gives a cost of the state;
a candidate searching device to obtain at least one optimum state candidate by using deterministic dynamics which describe time development of at least one variable of a state and generate a realization probability that takes a higher value at a state that attains a more optimum value of the cost function; and
an outputting device outputting the at least one optimum state candidate.

2. The processing device according to claim 1, further comprising:
a storing device storing the at least one optimum state candidate; and
an optimum state searching device obtaining a state close to an optimum state by changing respective states of the at least one optimum state candidate in a direction where a value of the cost function is improved.

3. A processing device, comprising:
an inputting device inputting a parameter;
a defining device defining a cost function which gives a cost of a state;
a setting device setting an adjustment function;
a calculating device obtaining one or more optimum state candidates by solving a differential equation which is described by the parameter, the cost function, and the adjustment function; and
an outputting device making an obtained calculation result visible, and presenting the result to a user.

4. The processing device according to claim 3, further comprising:
a storing device storing the one or more candidates; and
an optimum state searching device obtaining a state close to an optimum state by changing respective states of the one or more candidates in a direction where a value of the cost function is improved.

5. The processing device according to claim 3, wherein said setting device sets an adjustment function which generates a realization probability that takes a higher value at a state that attains a more optimum value of the cost function.

6. A computer-readable storage medium on which is recorded a program for directing a computer to perform a process, said process comprising:

setting a state which describes a problem and a cost function which gives a cost of the state;

obtaining at least one optimum state candidate by using deterministic dynamics which describe time development of at least one variable of a state and generate a realization probability that takes a higher value at a state that attains a more optimum value of the cost function; and outputting the at least one optimum state candidate.

7. A processing device, comprising:

inputting means for inputting information of a state which describes a problem and a cost function which gives a cost of the state;

candidate searching means for obtaining at least one optimum state candidate by using deterministic dynamics which describe time development of at least one variable of a state and generate a realization probability that takes a higher value at a state that attains a more optimum value of the cost function; and outputting means for outputting the at least one optimum state candidate.

8. A processing device, comprising:

inputting means for inputting a parameter;

defining means for defining a cost function which gives a cost of a state;

setting means for setting an adjustment function;

calculating means for obtaining one or more optimum state candidates by solving a differential equation which is described by the parameter, the cost function, and the adjustment function; and outputting means for making an obtained calculation result visible, and for presenting the result to a user.

* * * * *